United States Patent
Koziol et al.

(10) Patent No.: US 10,858,255 B2
(45) Date of Patent: Dec. 8, 2020

(54) METHOD, SYSTEM AND INJECTION SUBSYSTEM FOR PRODUCING NANOTUBES

(71) Applicant: FGV CAMBRIDGE NANOSYSTEMS LIMITED, Cambridge (GB)

(72) Inventors: Krzysztof Kazimierz Koziol, Cambridge (GB); Jerome Yi-Zhe Joaug, Cambridge (GB); Catharina Paukner, Cambridge (GB); Lukasz Kurzepa, Cambridge (GB)

(73) Assignee: FGV Cambridge Nanosystems Limited, Cambridge (GB)

( * ) Notice: Subject to any disclaimer, the term of this patent is extended or adjusted under 35 U.S.C. 154(b) by 183 days.

(21) Appl. No.: 16/109,939

(22) Filed: Aug. 23, 2018

(65) Prior Publication Data
US 2018/0362347 A1    Dec. 20, 2018

Related U.S. Application Data

(62) Division of application No. 15/022,616, filed as application No. PCT/GB2014/052792 on Sep. 15, 2014, now Pat. No. 10,087,077.

(30) Foreign Application Priority Data

Sep. 17, 2013  (GB) ................................. 1316472.8
Jan. 28, 2014  (GB) ................................. 1401443.5

(51) Int. Cl.
*C01B 21/064*    (2006.01)
*C01B 21/16*     (2006.01)
(Continued)

(52) U.S. Cl.
CPC ........ *C01B 32/164* (2017.08); *C01B 21/0646* (2013.01); *C01B 32/162* (2017.08);
(Continued)

(58) Field of Classification Search
CPC ....... C01B 21/00; C01B 21/06; C01B 21/064; C01B 21/0646; C01B 32/00; C01B 32/15;
(Continued)

(56) References Cited

U.S. PATENT DOCUMENTS 8,207,658 B2 * 6/2012 Talapatra ............... B82Y 30/00
                                                    313/341
9,045,343 B2 * 6/2015 Raney ................... C01B 32/162
(Continued)

FOREIGN PATENT DOCUMENTS

CN    100526217    8/2009
GB    2485339      5/2012
(Continued)

OTHER PUBLICATIONS

International Search Report in corresponding international application No. PCT/GB2014/052792 dated Mar. 26, 2015.
(Continued)

*Primary Examiner* — Natasha E Young
(74) *Attorney, Agent, or Firm* — Bookoff McAndrews, PLLC

(57) ABSTRACT

A floating catalyst chemical vapor deposition system produces nanotubes. The system includes a reaction chamber, a heater for heating a nanotube-material precursor and a catalyst precursor, and an injector for injecting the precursors into the chamber. In the chamber, the catalyst precursor is pyrolysed to produce catalyst particles, and the nanotube-material precursor is pyrolysed in the presence of the catalyst particles in order to produce nanotubes. A controller controls at least one operational parameter, e.g., injection
(Continued)

temperatures of the precursors, flow rates of carrier gases of the precursors, and a reaction temperature of the chamber and of the precursors. An injection pipe extends into the chamber to an adjustable extent in order to control the injection temperature of the catalyst precursor and/or the nanotube-material precursor.

18 Claims, 18 Drawing Sheets

(51) Int. Cl.
$$\begin{array}{ll}
C30B\ 25/00 & (2006.01) \\
C30B\ 29/40 & (2006.01) \\
C30B\ 29/60 & (2006.01) \\
C30B\ 29/64 & (2006.01) \\
C23C\ 16/455 & (2006.01) \\
D01F\ 9/08 & (2006.01) \\
D01F\ 9/133 & (2006.01) \\
C01B\ 32/164 & (2017.01) \\
C01B\ 32/162 & (2017.01) \\
B82Y\ 30/00 & (2011.01) \\
B82Y\ 40/00 & (2011.01)
\end{array}$$

(52) U.S. Cl.
CPC .... *C23C 16/4557* (2013.01); *C23C 16/45574* (2013.01); *C23C 16/45578* (2013.01); *C30B 25/00* (2013.01); *C30B 29/403* (2013.01); *C30B 29/602* (2013.01); *D01F 9/08* (2013.01); *D01F 9/133* (2013.01); *B82Y 30/00* (2013.01); *B82Y 40/00* (2013.01); *C01P 2002/82* (2013.01); *C01P 2002/88* (2013.01); *C01P 2004/03* (2013.01); *C01P 2004/04* (2013.01); *C01P 2004/13* (2013.01)

(58) Field of Classification Search
CPC ..... C01B 32/158; C01B 32/16; C01B 32/162; C01B 32/164; C30B 25/00; C30B 29/00; C30B 29/60; C30B 29/602; C30B 29/10; C30B 29/40; C30B 29/403; C23C 16/00; C23C 16/22; C23C 16/26; C23C 16/30; C23C 16/34; C23C 16/342; C23C 16/44; C23C 16/455; C23C 16/45563; C23C 16/4557; C23C 16/45574; C23C 16/45578; D01F 9/00; D01F 9/08; D01F 9/12; D01F 9/127; D01F 9/133; C01P 2002/00; C01P 2002/80; C01P 2002/82; C01P 2002/88; C01P 2004/00; C01P 2004/03; C01P 2004/04; C01P 2004/10; C01P 2004/13

See application file for complete search history.

(56) References Cited

U.S. PATENT DOCUMENTS

2008/0175785 A1* 7/2008 Mitra .................. B01J 20/205
423/445 B
2011/0150746 A1 6/2011 Khodadadi

FOREIGN PATENT DOCUMENTS

KR 10-2010-0028894 3/2010
WO 03072859 9/2003

OTHER PUBLICATIONS

Motta, M., et al., The parameter space for the direct spinning of fibres and films of carbon nanotubes, Phys. E. Low-Dimensional Syst Nanostructures, 2007;37:40-3.
Conroy, D., et al., Carbon nanotube reactor: Ferrocene decomposition, iron particle growth, nanotube aggregation and scale-up, Chem. Eng. Sci., 2010;65:2965-77.
Singh, C. et al., Towards the production of large-scale aligned carbon nanotubes, Chem. Phys. Lett., 2003;372:860-5.
Li, Y-L, et al., Direct spinning of carbon nanotube fibers from chemical vapor deposition synthesis, Science (80- ), 2004;304:276-8.
Koziol, K., et al., High-Performance Carbon Nanotube Fiber, Science (80- ), 2007;318:1892-5.
Schaffel, F., et al., Nanoengineered Catalyst Particles as a Key for Tailor-Made Carbon Nanotubes, Chem. Mater., 2007:5006-9.
Fiawoo, M-F., et al., Evidence of Correlation between Catalyst Particles and the Single-Wall Carbon Nanotube Diameter: A First Step towards Chirality Control, Phys. Rev. Lett., 2012;108:1-5.
Gavillet, J., et al., Root-Growth Mechanism for Single-Wall Carbon Nanotubes, Phys. Rev. Lett., 2001;87:2-5.
Milnera, M., et al., Periodic resonance excitation and intertube interaction from quasicontinuous distributed helicities in single-wall carbon nanotubes, Phys. Rev. Lett., 2000;84:1324-7.
Motta, M.S., et al., The role of sulphur in the synthesis of carbon nanotubes by chemical vapour deposition at high temperatures, J. Nanosci. Nanotechnol., 2008;8:2442-9.
Jorio, A., et al., Characterizing carbon nanotube samples with resonance Raman scattering, New J. Phys., 2003;5:139.1-139.17.
Pang, LSK., et al., Thermogravimetric analysis of carbon nanotubes and nanoparticles, J. Phys. Chem., 1993;97:6941-2.
Born, D., et al., Thermogravimetric Analysis of the Oxidation of Multiwalled Carbon Nanotubes: Evidence for the Role of Defect Sites in Carbon Nanotube Chemistry, Nano. Lett., 2002;2:615-9.
Koziol, K., Controlled continuous spinning of fibres of single wall carbon nanotubes, Guadalupe Workshop, Apr. 8-12, 2011.
Liu, Q., et al., Diameter-selective growth of single-walled carbon nanotubes with high quality by floating catalyst method, ACS Nano., vol. 2, No. 8, Aug. 2008, pp. 1722-1728.
Tang, D-M. et al., Controlled synthesis of quasi-one-dimensional boron nitride nanostructures, J. Mater. Res., vol. 2, No. 10, Oct. 2007, p. 2809.
Lourie, O. R., et al., CVD growth of boron nitride nanotubes, Chemistry of Materials, vol. 12, No. 7, Jul. 2000, pp. 1808-1810.
Engel-Herbert, R., et al., CVD synthesis and purification of single-walled carbon nanotubes using silica supported metal catalyst, Materials Letters, vol. 61, Nos. 11-12, Apr. 2007, pp. 2859-2593.
Hiraoka, T., et al., Control on the diameter of single-walled carbon nanotubes by changing the pressure in floating catalyst CVD, Carbon, 44, (2006), pp. 1845-1869.
GB Search Report in corresponding patent application GB 1401443.5 dated Jul. 28, 2014.
International Preliminary Report and Written Opinion in corresponding patent application PCT/GB2014/052792 dated Mar. 22, 2016.

* cited by examiner

METHOD, SYSTEM AND INJECTION SUBSYSTEM FOR PRODUCING NANOTUBES

CROSS-REFERENCE TO RELATED APPLICATIONS

This application is a divisional of U.S. application Ser. No. 15/022,616, filed on Mar. 17, 2016, now U.S. Pat. No. 10,087,077, which is the U.S. national phase entry under 35 U.S.C. § 371 of International Application No. PCT/GB2014/052792, filed on Sep. 15, 2014, which claims priority to GB Application No. 1401443.5, filed on Jan. 28, 2014, and GB Application No. 1316472.8, filed on Sep. 17, 2013.

FIELD OF THE INVENTION

The present invention relates to a floating catalyst chemical vapour deposition method, and associated apparatus, for producing nanotubes involving catalyst control. It is particularly applicable to the production of carbon nanotubes, for example single wall carbon nanotubes.

BACKGROUND TO THE INVENTION

Carbon nanotubes (CNTs) are essentially hollow tubes, of a honeycomb wall structure made from solely carbon atoms. There is particular interest in single wall carbon nanotubes (SWNTs) as they show remarkable electrical and electronic properties, combining either metallic or semi-conducting behaviour with tuneable band gap, very low density and high mechanical performance. In order to create a macroscopic material preserving the unique properties of the individual carbon nanotubes, it would be necessary to avoid any intermediate processing steps, which often introduce topological defects and substantially shorten the length of individual nanotubes.

A successful continuous method of floating catalyst chemical vapour deposition (FCCVD) CNT synthesis uses various carbon sources (including ethanol, hexane and methane) and an iron catalyst source such as ferrocene. The continuity of the process relies on various important parameters which ensure uninterrupted synthesis. In this process, the reaction time for the generation of active species and their role in the formation of nanotubes takes approximately 3 seconds. In the case of process scale-up one requires to use higher furnace temperatures to guarantee sufficient energy transfer to the precursor substances compared to the time available in substrate growth setups. Furthermore the complexity of the process and rapid synthesis can lead to instabilities and formation of undesirable carbonaceous and metallic impurities, interfering with the realisation of macroscopic materials with the outstanding properties of individual CNTs.

Until now, using this method a sulphur compound has always been required to control the size of the iron catalyst particles. Sulphur is known to form stable bonds with iron, thereby demobilizing the catalyst on the surface and preserving the particle in its current size and guaranteeing a narrow size distribution of the iron nanoparticles. Iron atoms become available from their ferrocene precursor from about 400° C. and start to collide in the reactor tube. During the time until carbon becomes available for reaction, the growth of iron particles by coalescence of the atoms is uncontrolled and produces a variety of sizes in iron clusters. Due to its high stability, $CH_4$ (methane) has a comparatively high pyrolization temperature and thus carbon only becomes available for reaction with the transition metal at around 1200° C. In order to keep these clusters small and in a narrow size range, sulphur compounds such as thiophene, carbon disulphide and others have been applied. These less stable hetero-compounds were chosen to release sulphur at temperatures similar to ferrocene pyrolization. Due to their high vapour pressure these sulphur compounds however are difficult to dose. Too much sulphur present for the reaction entirely encapsulates iron and thus hinders its catalytic activity completely. As a result, an excessive amount of very short, unaligned tubes are formed around the catalyst particles, commonly referred to as "impurities". Moreover, sulphur compounds suitable for the continuous CNT production process generally show a high toxicity for humans, particularly the hazard of reproductive damage. Therefore, developing a process without any sulphur utilization is highly desirable.

SUMMARY OF THE INVENTION

Embodiments of the present invention seek to provide a solution to the above problem by providing a method of catalyst control not requiring sulphur, for example.

According to a first aspect of the present invention there is provided a floating catalyst chemical vapour deposition method as defined in Claim 1 of the appended claims, for producing nanotubes. Thus, there is provided a floating catalyst chemical vapour deposition method for producing nanotubes, the method including: supplying a nanotube-material precursor and a catalyst precursor, heating said precursors and injecting said precursors into a heated reaction chamber containing a process gas (such as hydrogen, helium or argon, for example); pyrolysing the catalyst precursor within the reaction chamber to produce catalyst particles; and pyrolysing the nanotube-material precursor within the reaction chamber in the presence of the catalyst particles in order to produce nanotubes; wherein the method further comprises controlling the size of the catalyst particles at the point of pyrolysis of the nanotube-material precursor by controlling the operational parameters of the reaction chamber and/or of the precursor supplies.

By controlling the size of the catalyst particles at the point of pyrolysis of the nanotube-material precursor in this manner, this obviates the need for heteroatomic additives (e.g. sulphur-, nitrogen- or oxygen-containing compounds) to be provided to the catalyst, and preferably no heteroatomic additives are provided. This in turn mitigates any toxicity issues associated with the nanotube production process. The likelihood of impurities being present in the nanotube product is also reduced, thereby giving a cleaner material. It also removes any need for doping.

Further advantages are that the catalyst preparation process is simplified, undesirable reactions between the catalyst and the heteroatomic additives (e.g. iron atoms combining with nitrogen or sulphur atoms to produce $Fe_xN$ or FeS) are avoided, and there is no need to remove reaction products of this kind (e.g. $Fe_xN$ or FeS) during the course of the nanotube production process. This in turn makes the overall production process more efficient and better suited to continuous, scalable, one-step operation.

The expression "the reaction chamber containing a process gas" should be interpreted broadly, to encompass a dedicated process gas that is used to prefill the reaction chamber, and also the use of a carrier gas (used to transport one or both of the precursors to the reaction chamber) as the process gas.

Optional features are set out in the dependent claims.

The nanotubes may be carbon nanotubes, in which case the nanotube-material is carbon, and the nanotube-material precursor is a carbon precursor. The carbon precursor may be ethanol, hexane or methane, for example, or toluene.

Alternatively, the nanotubes may be boron nitride nanotubes, in which case the nanotube-material is boron nitride, and the nanotube-material precursor is a boron nitride precursor. The boron nitride precursor may be borazine, for example (and the borazine may itself be produced in situ from $NH_3$ and $B_2H_6$ (diborane)).

With either the production of carbon nanotubes or that of boron nitride nanotubes, the catalyst precursor may comprise a transition metal derivative such as cobaltocene, ferrocene and nickelocene, for example, or iron pentacarbonyl, or a non-metallic precursor such as zirconium oxide powder or silica powder either independently or in combination with transition metals, or any of the above-mentioned catalyst precursors in combination.

During the production of the nanotubes, catalyst particles are produced by pyrolysing the catalyst precursor within the reaction chamber. For example, iron catalyst particles may be produced from ferrocene (this being an iron derivative), cobalt catalyst particles may be produced from cobaltocene (a cobalt derivative), or nickel catalyst particles may be produced from nickelocene (a nickel derivative). Many other examples of catalysts for nanotube production are possible, as those skilled in the art will appreciate.

In one possible embodiment the catalyst precursor is heated to its sublimation temperature and the nanotube-material precursor is heated to its vaporisation temperature.

The catalyst precursor is preferably injected close to its pyrolisation temperature and the nanotube-material precursor is preferably injected close to its pyrolisation temperature. The term "close" in the context of these injection temperatures should be interpreted broadly, to refer to a temperature that is elevated but which is not as high as the pyrolisation temperature itself. In practice, the injection temperature is determined experimentally and depends on the precursor material in question. For example, in the case of ferrocene the ideal injection temperature is typically in the range of 300-320° C., whereas pyrolisation of ferrocene occurs at 400° C.

Preferably the nanotube-material atoms contact the catalyst particles such that the nanotube-material atoms act as an arresting agent that limits the growth of the catalyst particles.

The nanotube-material precursor may be injected using a carrier gas (such as hydrogen, helium or argon, for example). Likewise, the catalyst precursor may be injected using a carrier gas (such as hydrogen, helium or argon, for example). The carrier gas may be the same as the process gas.

The nanotube-material precursor may be injected into the reaction chamber using a first injection pipe, and the catalyst precursor may be injected into the reaction chamber using a second injection pipe. The term "injection pipe" as used herein should be interpreted broadly, to encompass pipes which are tapered or terminate in some kind of nozzle, as well as pipes of a constant cross-section.

The process gas may be injected using a third injection pipe.

In some cases, at least two of the nanotube-material precursor, the catalyst precursor and the process gas may be injected into the reaction chamber via a common injection pipe. This may involve pre-mixing the at least two gases before supplying them to the common injection pipe.

Preferably, for a given catalyst, controlling the operational parameters of the reaction chamber and/or precursor supplies comprises controlling one or more of: the injection temperature of the catalyst precursor, the flow rate of the carrier gas of the catalyst precursor (which in turn can affect the concentration of the catalyst precursor); the injection temperature of the nanotube-material precursor; the flow rate of the carrier gas of the nanotube-material precursor (which in turn can affect the concentration of the nanotube-material precursor); and the reaction temperature.

The catalyst precursor may be injected by an injection pipe having an adjustable length within the reaction chamber, in which case controlling the injection temperature of the catalyst precursor may comprise adjusting the distance by which its injection pipe extends into the reaction chamber.

Likewise, the nanotube-material precursor may be injected by an injection pipe having an adjustable length within the reaction chamber, in which case controlling the injection temperature of the nanotube-material precursor may comprise adjusting the extent to which its injection pipe extends into the reaction chamber.

Alternatively, or in addition, controlling the injection temperature of the catalyst precursor may comprise controlling the temperature of its injection pipe (e.g. by heating, cooling or otherwise regulating the temperature of the injection pipe).

Likewise, controlling the injection temperature of the nanotube-material precursor may comprise controlling the temperature of its injection pipe (e.g. by heating, cooling or otherwise regulating the temperature of the injection pipe).

Alternatively, or in addition, controlling the injection temperature of the catalyst precursor and/or the nanotube-material precursor may comprise controlling the heating of the catalyst precursor and/or the nanotube-material precursor before they are injected.

Through the above techniques which affect the injection temperature of the catalyst precursor, this enables the point of injection of the catalyst precursor to be optimised. This is important, since injection at too low a temperature can result in the formation of a great variety of catalyst particle diameters, whereas injection at too high a temperature can result in the catalyst precursor pyrolising within the (comparatively) narrow space of the injector pipe. The resulting higher collision probability produces catalyst particles of large diameters which in turn catalyse wide diameter CNTs.

In certain embodiments the method further comprises: pre-storing (e.g. in a computer-processor-controlled data storage device) data relating nanotube diameters with corresponding predetermined sets of operational parameters of the reaction chamber and/or precursor supplies; and controlling the operational parameters of the reaction chamber and/or precursor supplies comprises: selecting, from the pre-stored operational parameters, the operational parameters corresponding to a desired nanotube diameter; configuring the reaction chamber and/or precursor supplies according to the selected operational parameters; and then carrying out the chemical vapour deposition process to produce nanotubes having the desired diameter.

Alternatively, controlling the operational parameters of the reaction chamber and/or precursor supplies may comprise producing one or more samples of nanotubes, removing the sample(s) from the reaction chamber, determining the size of catalyst particles present in the sample(s), comparing the determined catalyst particle size with a predetermined target particle size, and adjusting the operational parameters in dependence on the result of the comparison.

As a further alternative, controlling the operational parameters of the reaction chamber and/or precursor supplies may comprise operating a particle counter in the reaction chamber, processing the particle count results to determine the size of catalyst particles present in the reaction chamber, comparing the determined particle sizes with a predetermined target particle size value, and adjusting the operational parameters in dependence on the result of the comparison.

Preferably the method further comprises extracting the nanotubes using a continuous extraction process. The continuous extraction process may be used to produce a fibre, yarn or ribbon, for example, or a powdered mass of nanotubes.

According to a second aspect of the present invention there is provided a floating catalyst chemical vapour deposition system for producing nanotubes, the system including: means for supplying a nanotube-material precursor and a catalyst precursor, means for heating said precursors, and means for injecting said precursors into a heated reaction chamber containing a process gas (such as hydrogen, helium or argon, for example); means for pyrolysing the catalyst precursor within the reaction chamber to produce catalyst particles, and means for pyrolysing the nanotube-material precursor within the reaction chamber in the presence of the catalyst particles in order to produce nanotubes; and means for controlling the operational parameters of the reaction chamber and/or of the precursor supplies in order to control the size of the catalyst particles at the point of pyrolysis of the nanotube-material precursor.

Optional or preferable features relating to the second aspect of the invention correspond to the optional or preferable features mentioned above in respect to the first aspect of the invention.

Preferably the system further comprises an injector subsystem comprising: a first portion having a first set of injection pipes for receiving species (e.g. gases, liquids, vaporised solids, vaporised liquids, etc.) for delivery into the reaction chamber; and an interface portion that is removably attachable between the first portion and the reaction chamber, the interface portion comprising at least one injection pipe arranged to receive the species provided by the first set of injection pipes and to inject said species into the reaction chamber; the injector subsystem being operable such that, with the interface portion removed, said first set of injection pipes are operable to individually inject their respective species into the reaction chamber, and with the interface portion attached, a pre-mixing chamber is defined by the interface portion in combination with the first portion, for pre-mixing the species provided by the first set of injection pipes prior to the species entering the at least one injection pipe of the interface portion.

By virtue of the removable interface portion, the injector subsystem can be quickly and straightforwardly transitioned from a first configuration (with the interface portion present) in which the species received from the first set of injection pipes are pre-mixed in the pre-mixing chamber and then injected into the reaction chamber via the at least one injection pipe of the interface portion; to a second configuration (without the interface portion present) in which the injected species are injected separately into the reaction chamber via the first set of injection pipes; and vice versa.

Preferably the extent to which each of the first set of injection pipes protrudes within the first portion is adjustable. This enables the injection temperature of the injected species to be adjusted, when the first set of injection pipes are arranged to inject directly into the reaction chamber.

Likewise, preferably the extent to which the at least one injection pipe of the interface portion extends into the reaction chamber is adjustable. This enables the injection temperature of the pre-mixed species to be adjusted, when the interface portion is attached for pre-mixing and then injecting the pre-mixed species into the reaction chamber.

In one embodiment of the injector subsystem, when the interface portion is attached, the side walls of the pre-mixing chamber are provided by the first portion. Alternatively, when the interface portion is attached, the side walls of the pre-mixing chamber may be provided by the interface portion. In a further alternative, when the interface portion is attached, the side walls of the pre-mixing chamber may be provided partly by the first portion and partly by the interface portion.

Preferably the injector subsystem comprises one or more temperature sensors and one or more heating elements for controlling the temperature of the species being injected. More preferably the injector subsystem comprises a plurality of temperature sensors and a plurality of heating elements for controlling the temperature of the species being injected.

Preferably the walls of the injector subsystem are formed from metal, and particularly preferably from a single piece of metal.

According to a third aspect of the invention there is provided an injector subsystem for attachment to a reaction chamber, the injector subsystem comprising: a first portion having a first set of injection pipes for receiving species for delivery into the reaction chamber; and an interface portion that is removably attachable between the first portion and the reaction chamber in use, the interface portion comprising at least one injection pipe arranged to receive the species provided by the first set of injection pipes and to inject said species into the reaction chamber in use; the injector subsystem being operable in use such that, with the interface portion removed, said first set of injection pipes are operable to individually inject their respective species into the reaction chamber, and with the interface portion attached, a pre-mixing chamber is defined by the interface portion in combination with the first portion, for pre-mixing the species provided by the first set of injection pipes prior to the species entering the at least one injection pipe of the interface portion.

Preferably the extent to which each of the first set of injection pipes protrudes within the first portion is adjustable. Likewise, preferably the extent to which the at least one injection pipe of the interface portion extends into the reaction chamber is adjustable.

In one embodiment of the injector subsystem, when the interface portion is attached, the side walls of the pre-mixing chamber are provided by the first portion. Alternatively, when the interface portion is attached, the side walls of the pre-mixing chamber may be provided by the interface portion. In a further alternative, when the interface portion is attached, the side walls of the pre-mixing chamber may be provided partly by the first portion and partly by the interface portion.

Preferably the injector subsystem comprises one or more temperature sensors and one or more heating elements for controlling the temperature of the species being injected. More preferably the injector subsystem comprises a plurality of temperature sensors and a plurality of heating elements for controlling the temperature of the species being injected.

Preferably the walls of the injector subsystem are formed from metal, and particularly preferably from a single piece of metal.

According to a currently-preferred embodiment the injection system is for use with a reactor for carbon nanotube synthesis. The injector has at least one injection pipe which carries gas(es) or liquid(s) comprising a carbon precursor and a catalyst precursor into a heated reaction chamber. The at least one injection pipe has a length such that the carbon precursor is injected close to its pyrolisation temperature. Further, the at least one injection pipe has a length such that the catalyst precursor is injected close to its pyrolisation temperature. The injector allows the carbon precursor and catalyst precursor to react for a limited period of time while both are close to their pyrolisation temperature.

Additionally, in this embodiment, the injector has a system for controlling the flow rate of the at least one injection pipe.

Preferably, in this embodiment, the injector has at least one injection pipe which conveys gas(es) or liquid(s) comprising hydrogen. Preferably the at least one injection pipe is movable so as to inject the flow at different depths into the reaction chamber.

Further, in this embodiment, the injection system preferably comprises a pre-mixing chamber in which the carbon precursor, hydrogen and the catalyst precursor are pre-mixed before going into the at least one injection port.

Further, in this embodiment, the injection system preferably has at least one injection pipe which is temperature controlled by a temperature control system.

Preferably, in this embodiment, the injection system is used with a reaction chamber which has a steep temperature gradient. The injection system may be made of metallic materials.

BRIEF DESCRIPTION OF THE DRAWINGS

Embodiments of the invention will now be described, by way of example only, and with reference to the drawings in which.

DETAILED DESCRIPTION OF PREFERRED EMBODIMENTS

The present embodiments represent the best ways known to the applicants of putting the invention into practice. However, they are not the only ways in which this can be achieved.

Overview

Carbon nanotube (CNT) growth in the gas phase requires a homogenous, continuous delivery of precursors such as carbon and catalyst source, carrier gas and possible promoter precursor or additives. Gases like the carrier gas and gaseous carbon sources can be injected directly through pipes of varying diameter and at varying position within the reactor tube. The gas flow is controlled by mass flow controllers. For liquid and solid precursors a carrier gas streams through the material, transporting the temperature controlled substance with it into the reactor.

The substance flow is controlled by adjusting its vapour pressure via its temperature and the flow rate of the carrier gas stream.

The present embodiments involve the control of the size of the catalyst particles at the point of pyrolysis of the nanotube-material (e.g. carbon) precursor by controlling the operational parameters of the reaction chamber and/or of the precursor supplies.

Materials

As described below, the present embodiments may be used to produce carbon nanotubes using a carbon precursor such as ethanol, hexane or methane, for example, or toluene.

Alternatively, the techniques described herein may be adapted to produce boron nitride nanotubes. The boron nitride precursor may be borazine, for example. The borazine may be produced in situ from $NH_3$ and $B_2He$ (diborane).

With either the production of carbon nanotubes or that of boron nitride nanotubes, the catalyst precursor may comprise a transition metal derivative such as cobaltocene, ferrocene and nickelocene, for example, or iron pentacarbonyl, or a non-metallic precursor such as zirconium oxide powder or silica powder either independently or in combination with transition metals, or any of the above-mentioned catalyst precursors in combination.

During the production of the nanotubes, catalyst particles are produced by pyrolysing the catalyst precursor within the reaction chamber. For example, iron catalyst particles may be produced from ferrocene (this being an iron derivative), cobalt catalyst particles may be produced from cobaltocene (a cobalt derivative), or nickel catalyst particles may be produced from nickelocene (a nickel derivative).

Many other examples of catalysts for nanotube production are possible, as those skilled in the art will appreciate.

Once produced, the nanotubes may be extracted using a continuous extraction process. The continuous extraction process may be used to produce a fibre, yarn or ribbon, for example, or a powdered mass of nanotubes.

Injection Style

Dependent on the chosen precursor composition and the desired material it can be advantageous to swap between injecting all precursors including reaction carrier gas through the same pipe, or splitting them up into multiple pipes according to their purpose.

Figure 1:
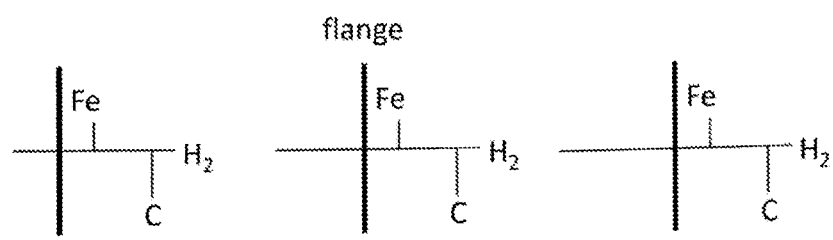
FIG. 1 is a schematic diagram of a single port injection system (in three alternative configurations) with varied injection depth for injection temperature variation.

FIG. 1 is a schematic diagram of a single port injection system. In each of the three drawings of the schematic, the interior of a reaction chamber is to the left of the thick vertical line, with the thick vertical line denoting a flange in the chamber wall. The exterior of the reaction chamber is to the right of the thick vertical line. A single injection pipe (the horizontal line) passes through the flange in the chamber wall. Supplies of precursors and reaction carrier gas (in the illustrated example, Fe, C and $H_2$) feed into the single injection pipe outside the reaction chamber. The distance to which the single injection pipe extends into the reaction chamber is adjustable (as shown in the three schematics in FIG. 1), with the adjustability of this distance providing a means for controlling the injection temperature of the precursors and carrier gas.

Injecting all precursors through the same pipe ensures a homogenous distribution of all the elements involved in CNT synthesis. The carrier gas stream guarantees that all compounds are transported into the reactor. Catalyst particles will be readily available in the proximity of the carbon atoms nascent from precursor pyrolisation. It is the standard method for feedstock injection in CNT growth at present as it is a clear, straightforward piping setup that requires heating and monitoring injection temperature at one pipe and outlet only.

Figure 2:
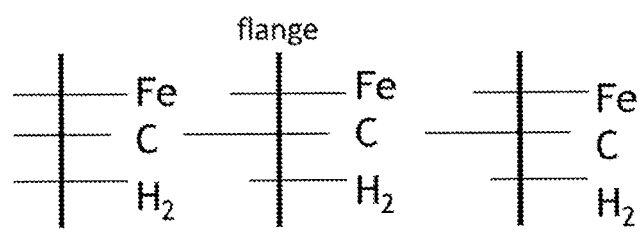
FIG. 2 is a schematic diagram of a multi-port injection system (in three alternative configurations) with separate injection of precursors for individual depth variation.

FIG. 2 is a schematic diagram of a multi-port injection system, in which a plurality of separate injection pipes (as illustrated by the three horizontal lines in each of the three drawings of the schematic) pass through the flange (or through separate flanges) in the chamber wall. Each of the separate injection pipes conveys a different precursor or reaction carrier gas (although, if desired, a given pipe in a multi-port system can be used to convey a mixture of precursors or carrier gas). The distance to which each injection pipe extends into the reaction chamber is individually adjustable (as shown in the three schematics in FIG. 2), thereby providing means for individually controlling the injection temperature of each of the precursors or the carrier gas.

Injecting substances through separate injection pipes has several advantages over a single port injection system.

Injection Pipes

The first and most important rule in precursor transport is to heat the pipes. All pipes should be heated, ideally to the same temperature which is close to or above the boiling point of the highest boiling substance but below the lowest pyrolisation temperature. This is to avoid precipitation and blockage on cold spots of the pipes.

Commonly used pipes for a lab reactor tube of 50-100 mm diameter have inner diameters around 2-8 mm. The choice of injection pipes depends on the substance passing through: carrier gas streams loaded with solid catalyst precursor should come in wider pipes to avoid blockages. The main reaction carrier gas can be injected through smaller diameter tubes to ensure the required velocity for substances to be pushed into the reaction zone.

Since the injector is on the outside with increasing temperature along the heated furnace tube the injection depth corresponds with the injection temperature. The injection temperature is a fundamental parameter as it determines the mean free path between pyrolysing species and therefore their collision and coalescence probability.

2-in-1 Injector

We have developed a unique combination of a single and multi-port injector where the operator can easily change over between the two. We therefore refer to this as our "2-in-1" injector.

Figure 3:
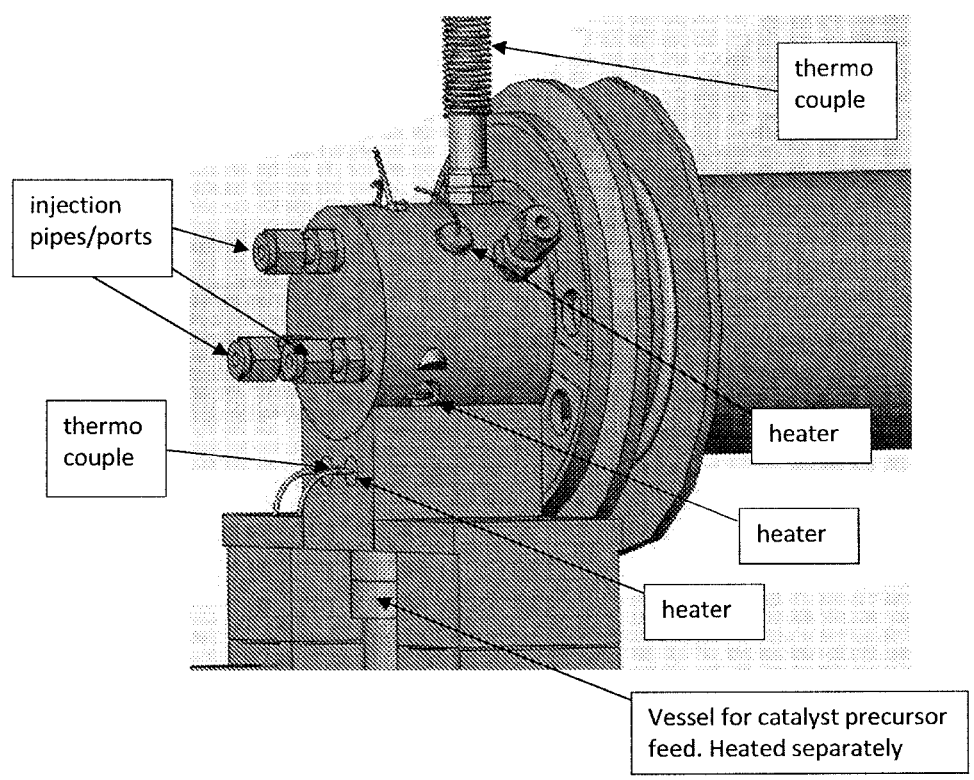
FIG. 3 illustrates an innovative 2-in-1 injector system developed for easy switch over and combining advantages of both single and multi-port injection systems.
Figure 4:
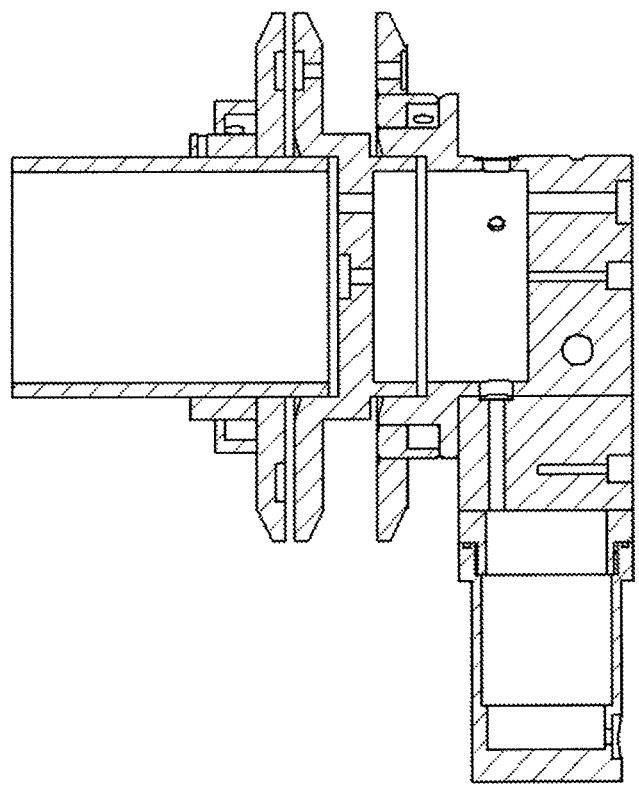
FIG. 4 is a cross-sectional view of the injector system of FIG. 3 with a closed chamber.
Figure 5:
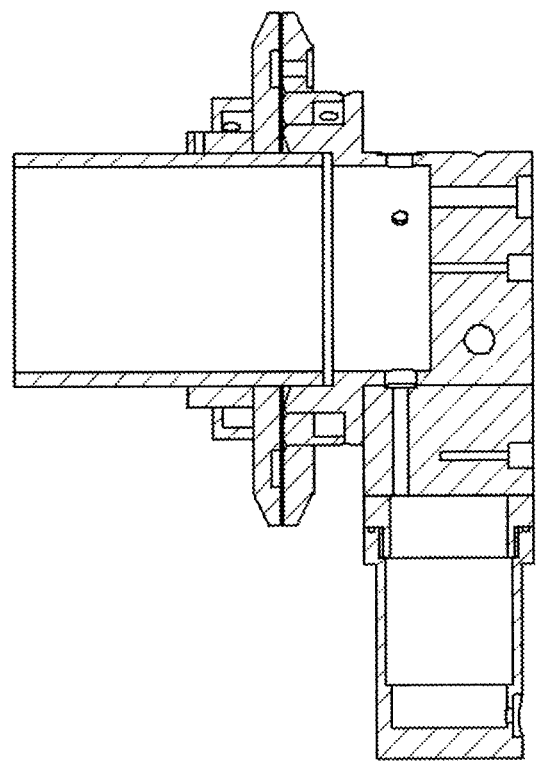
FIG. 5 is a cross-sectional view of the injector system of FIG. 3 with an open chamber.

An example of our innovative 2-in-1 injector is illustrated in FIGS. 3-5. The presently-preferred embodiment is fabricated from a single piece of stainless steel to ensure optimal temperature exchange. Nozzle heaters provide a homogenous temperature profile over the entire injector and prevent precipitation of solids. Solid feedstock is readily introduced into the reactor via the screw-in vessel at the bottom of the injector. A porous glass filter allows carrier gas to pass through and transport the tempered and vapour pressure controlled substance into the reactor. The temperature is easily adapted to the precursor feedstock of choice. Thermocouples are fitted to read both metal and injection chamber temperature. An intermediate flange with cone shaped volume provides the option of adding a pre-mix chamber before ultimate injection into the reactor. Compression fittings allow for step-less adjustment of the injection depth and ensure a tight fit of all pipes, preventing leakages and air from entering the reactor. The tilted shape of the flanges makes opening and closing the injector very convenient. Quick release clamps ensure a tight fit during operation and handy, easy removal after runs.

With further reference to FIG. 3, the 2-in-1 injector system is made entirely from metal, with temperature sensors and heaters in place to adjust the temperature at the various points of the injector. This is important because it makes the injection process significantly more stable and reliable, as it avoids precipitation or condensation of solid or liquid precursors.

More particularly, the temperature can be adjusted independently in four parts of the injector, as follows:
(1) the temperature of the catalyst precursor vessel, in order to control the vapour pressure of the precursor and to facilitate the fed amount of material independent of the carrier gas volume;
(2) the temperature of a vessel carrying liquid or solid carbon precursor, for the same reason as (1);
(3) the temperature above the catalyst precursor vessel, in order to avoid precipitation of the (predominantly solid) material;
(4) the temperature around the other five (in this case) injection ports, controlling the temperature in the pre-mix chamber if applicable.

This gives a substantial improvement in comparison to other methods in which pipes are heated with heating bands or cords (that burn through after a short time) and are separately insulated with alumina wool or similar. Such heating and insulation has to be removed every time adjustments of the injection ports need to be carried out, and also does not ensure full cover heating, leaving cold spots that create blockages of the pipes when material precipitates.

FIG. 4 shows the injector including middle flange with pre-mix chamber in place (this configuration corresponding to FIG. 8 described later). Precursors are injected into the pre-mix chamber, heated to the set temperature and injected into the reactor dependent on the chosen pipe length attached to the compression fitting at the outlet. This enables a homogenous mass distribution and temperature of the injected species, in the manner as described above in relation to FIG. 1.

FIG. 5 shows the injector without middle flange (this configuration corresponding to FIG. 7 described later). Precursors are injected directly into the reactor via separate injection nozzles, offering the flexibility to vary injection depth individually for each compound in the manner as described above in relation to FIG. 2.

Figure 6:
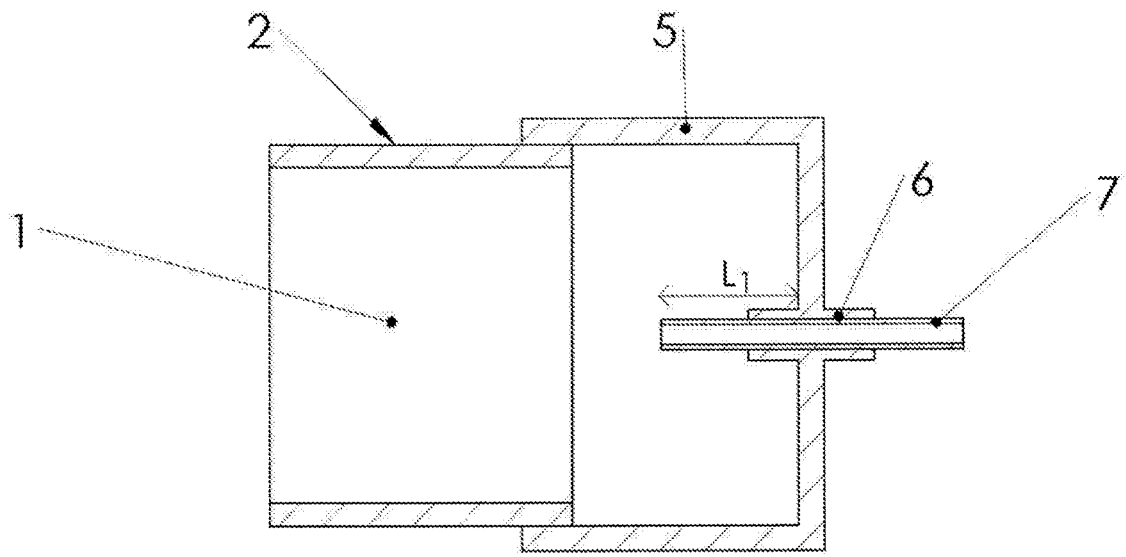
FIG. 6 is a cross-sectional side view schematic diagram of the injector system with a single injection port.
Figure 7:
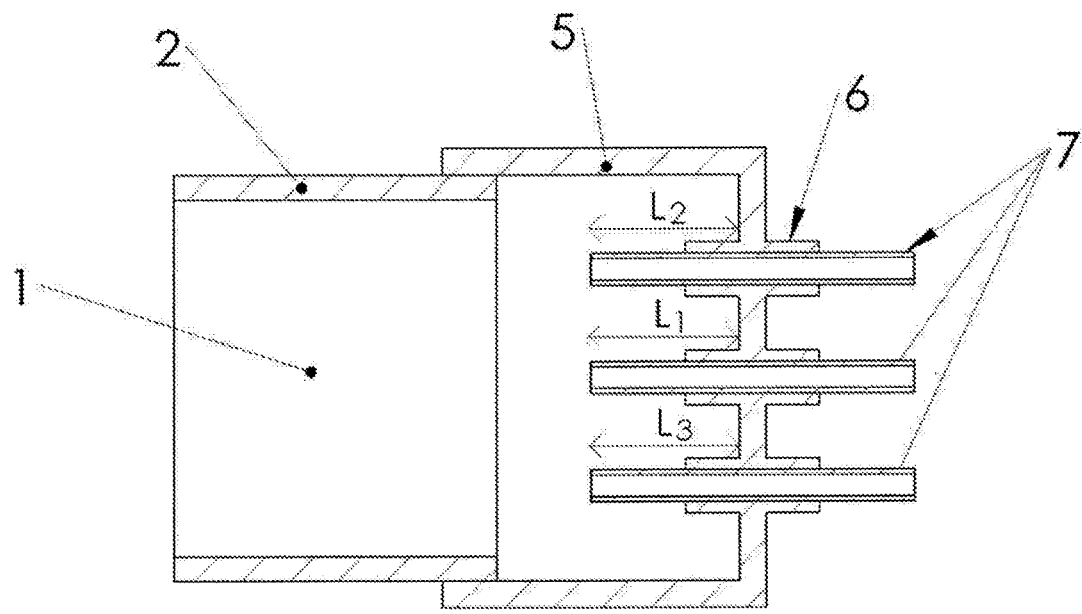
FIG. 7 is a cross-sectional side view schematic diagram of the injection system with multiple injection ports.
Figure 8:
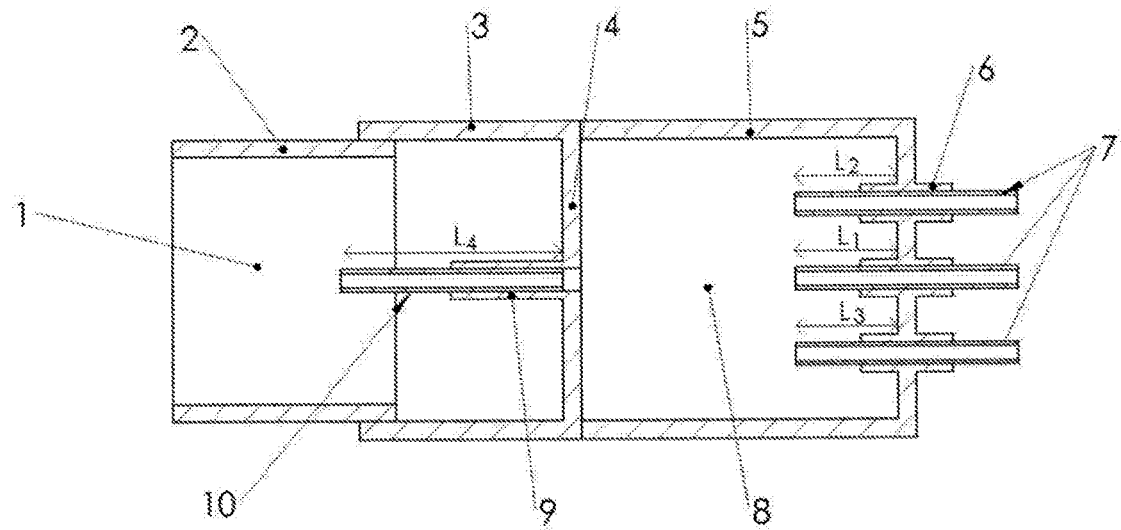
FIG. 8 is a cross-sectional side view schematic diagram of the injector system with a pre-mixing chamber.

FIGS. 6, 7 and 8 provide cross-sectional side view schematic diagrams which explain in more detail the principles of operation of the 2-in-1 injector system. FIG. 6 illustrates the injector system with a single injection port, FIG. 7 illustrates the injection system with multiple injection ports, and FIG. 8 illustrates the injector system with a pre-mixing chamber.

With reference initially to FIG. 6, shown at 1 is the upstream part of the reaction chamber. The walls of the reaction chamber and the injection system are respectively marked out by 2 and 5. At least one injection pipe 7 is provided, which is preferably provided with a slider 6 such that the pipe 7 is movable. Other systems or means for making the pipe movable are possible. The movable arrangement of the pipe 7 allows injection of the injected species at an adjustably-variable distance into the reaction chamber. This variable distance is shown as $L_1$ and is typically between 0 and 30 cm, such that, at sufficiently high distances of $L_1$, the injection point can be far inside the reaction chamber. Preferably, this distance is used for controlling the injection temperature of the injected species. Since the reaction chamber 1 is heated, the distance $L_1$ has a primary role in determining the injection temperature of the injected species. Other means for controlling the injection temperature are however possible.

With reference now to FIG. 7, this shows the injection system in the multiport configuration. As shown, the three injection pipes or ports 7 are all individually movable and can carry a flow at different distances $L_1$, $L_2$ and $L_3$ into the reaction chamber 1. This configuration allows independent injection of the catalyst precursor, carbon precursor and other carrier gas into the reaction chamber. By adjusting distances $L_1$, $L_2$ and $L_3$, this enables the injection temperature of the species injected via each injection pipe to be independently adjustable. Other means for controlling the injection temperatures are however possible.

With reference to FIG. 8, this shows the injection system with a pre-mixing chamber configuration. Gases are first mixed in a pre-mixing chamber 8, before being injected into the reaction chamber 1 via at least one injection pipe or port 10 of adjustable length $L_4$ provided with a slider 9. The reaction chamber walls are still shown at 2. The injection system interface with the reaction chamber is shown at 3. The wall between the injection system interface and the pre-mixing chamber is shown at 4. Lastly, the pre-mixing chamber and its walls are shown respectively at 8 and 5.

With the 2-in-1 injector system, the interface (or "flange") part 3 is removable from the rest of the apparatus. With the interface 3 in place, as shown in FIG. 8, the injection system is rendered pre-mixing. The gases, supplied via pipes 7, are pre-mixed in chamber 8 and then injected into the reaction chamber 1 via the at least one injection pipe 10 of adjustable length $L_4$, the adjustable length $L_4$ providing means for temperature control of the pre-mixed injected species.

On the other hand, with the interface 3 removed, as shown in FIG. 7, the gases are injected into the reaction chamber 1 via separate injection pipes 7, of independently-adjustable lengths $L_1$, $L_2$ and $L_3$, enabling independent temperature control of each injected species.

Thus, by virtue of the removable interface 3, the 2-in-1 injector system can be quickly and straightforwardly transitioned from a first configuration (with the interface present) in which the injected species are pre-mixed and injected via one or more adjustable injection pipe 10, to a second configuration (without the interface) in which the injected species are injected separately via independently-adjustable injection pipes 7, and vice versa.

In the embodiment of the injector system as illustrated, when the interface 3 is attached, the side walls 5 of the pre-mixing chamber 8 are provided by the walls of the component having the set of injection pipes or ports 7. In alternative embodiments, however, when the interface part is attached, the side walls of the pre-mixing chamber may be provided by the interface part. In a further alternative, when the interface part is attached, the side walls of the pre-mixing chamber may be provided partly by the component having the set of injection pipes or ports, and partly by the interface part.

The embodiments described above are provided by way of example only, and various other modifications will be apparent to persons skilled in the art.

Once the actual injection system has been optimised for the purpose, carbon nanotubes (CNTs) can be produced from a variety of feedstock. In order to control the size of the CNTs produced it is important to control the size of the catalyst particle. While this can be done in many ways, like employing confined substrates, or substrates of certain crystallinity, as well as adding heteroatomic additives which cage the catalyst clusters at a certain size and structure, we have found that CNTs can be grown in the gas phase without heteroatomic additives of any sort (such as sulphur, nitrogen or oxygen), avoiding the aforementioned drawbacks.

Changing the injection temperature by adjusting the length of the injection pipe(s) within the reaction chamber is just one example of changing the operational parameters of the reaction chamber and/or the precursor supplies in order to control the size of the catalyst particles at the point of pyrolysis of the nanotube-material (e.g. carbon) precursor.

More generally, for a given catalyst, in order to control the size of the catalyst particles at the point of pyrolysis of the nanotube-material (e.g. carbon) precursor, any of the following operational parameters of the reaction chamber and/or of the precursor supplies may be adjusted:

the injection temperature of the catalyst precursor;
the flow rate of the carrier gas of the catalyst precursor;
the injection temperature of the nanotube-material precursor;
the flow rate of the carrier gas of the nanotube-material precursor; and
the reaction temperature.

With regard to controlling the injection temperature of the catalyst precursor and/or the nanotube-material precursor, in addition to (or instead of) adjusting the length of the injection pipe(s) into the reaction chamber, the injection temperature of the catalyst precursor and/or the nanotube-material precursor may be controlled by controlling the temperature of the injection pipe(s) themselves (e.g. by heating, cooling or otherwise regulating the temperature of the injection pipe(s)), and/or by controlling the heating of the catalyst precursor and/or the nanotube-material precursor before they are injected.

Adjusting the flow rate of the carrier gas of the catalyst precursor and/or the nanotube-material precursor can affect the concentration(s) of the respective species, which also influences the size of the catalyst particles at the point of pyrolysis of the nanotube-material.

The reaction temperature itself also influences the size of the catalyst particles at the point of pyrolysis of the nanotube-material.

In one embodiment the method may further comprise: pre-storing (e.g. in a computer-processor-controlled data storage device) data relating nanotube diameters with corresponding predetermined sets of operational parameters of the reaction chamber and/or precursor supplies; and controlling the operational parameters of the reaction chamber and/or precursor supplies may comprise: selecting, from the pre-stored operational parameters, the operational parameters corresponding to a desired nanotube diameter; configuring the reaction chamber and/or precursor supplies according to the selected operational parameters; and then carrying out the chemical vapour deposition process to produce nanotubes having the desired diameter.

Alternatively, controlling the operational parameters of the reaction chamber and/or precursor supplies may comprise producing one or more samples of nanotubes, removing the sample(s) from the reaction chamber, determining the size of catalyst particles present in the sample(s) (e.g. using transmission electron microscopy), comparing the determined catalyst particle size with a predetermined target particle size, and adjusting the operational parameters in dependence on the result of the comparison.

As a further alternative, controlling the operational parameters of the reaction chamber and/or precursor supplies may comprise operating a particle counter in the reaction chamber, processing the particle count results to determine the size of catalyst particles present in the reaction chamber, comparing the determined particle sizes with a predetermined target particle size value, and adjusting the operational parameters in dependence on the result of the comparison.

In the following the effects of avoiding sulphur on the morphology of the CNTs are shown using a precursor system of toluene and ferrocene. Beside the fact that this process provides a less toxic way to form CNTs from fewer ingredients than those reported so far [1, 2], the resulting material shows to be cleaner and at optimised conditions made from long bundles of SWCNTs.

Growth of CNTs

Using the floating catalyst process for continuous CNT production described elsewhere [3, 4], the vaporized carbon and catalyst precursors are injected into a tube furnace of 1 m heated length and 10 cm diameter using helium as carrier gas. Hydrogen is used at all times in this process. It acts as the reaction medium for the floating catalyst and subsequent formation of the carbon nanotube aerogel in the central hot zone of the furnace which is maintained at 1200° C. In order to allow for continuous extraction of CNTs, the furnace is open to the environment at the other end. At this point hydrogen is extracted and diluted with inert gas to ensure safety and smooth operation of the collection process.

The formation of carbon nanotubes in the floating catalyst process is very fast. At the typical rate, the process creates CNTs from the precursors (precursor pyrolysis, CNT formation, bundling) in at most 3 seconds. The length of nanotubes averages to about 1 mm [5], which indicates that the growth of nanotubes happens in a very short time window. Subtracting the cold zones of the furnace, individual CNTs grow at a rate of about 0.5 mm/sec.

An important parameter in the control of the nanotube type is the diameter of the catalyst nanoparticle, which defines the diameter of the resulting nanotube [6-8]. Various carbon sources such as methane, ethanol, ethylene and toluene were tested to identify the precursor that would offer the possibility to continuously produce CNTs without sulphur addition. These carbohydrates vary in terms of their pyrolisation temperature as well as carbon number per molecule and hybridization. The optimal combination of these parameters to enable continuous CNT production without sulphur addition could be identified when toluene was used as the C source. Carbon (toluene), iron (ferrocene) and sulphur precursor (thiophene) together with the hydrogen carrier gas stream were injected via the same pipe (stainless steel pipe of ¼-inch outside diameter) at a constant injection depth of 15 cm (i.e. how far the injector stem reaches into the reactor). Keeping constant both carbon flow at 0.20 mmol/min and Fe/C ratio at 0.002, the sulphur amount was varied from S/C 0.05 to 0.03, 0.02 (atomic ratio) and no sulphur addition. As a result, the effect of thiophene presence in the injection feedstock for CNT synthesis was investigated.

In a subsequent set of experiments, the influence of different Fe/C ratios was explored. Here the helium carrier gas flow was varied while the ferrocene temperature was kept constant. Lastly the general effect of varied injection temperature on the morphology of material from a no-S feedstock was investigated. For this purpose the injection depth was varied to 10 and 5 cm.

Results

Sulphur Effect

Figure 9:
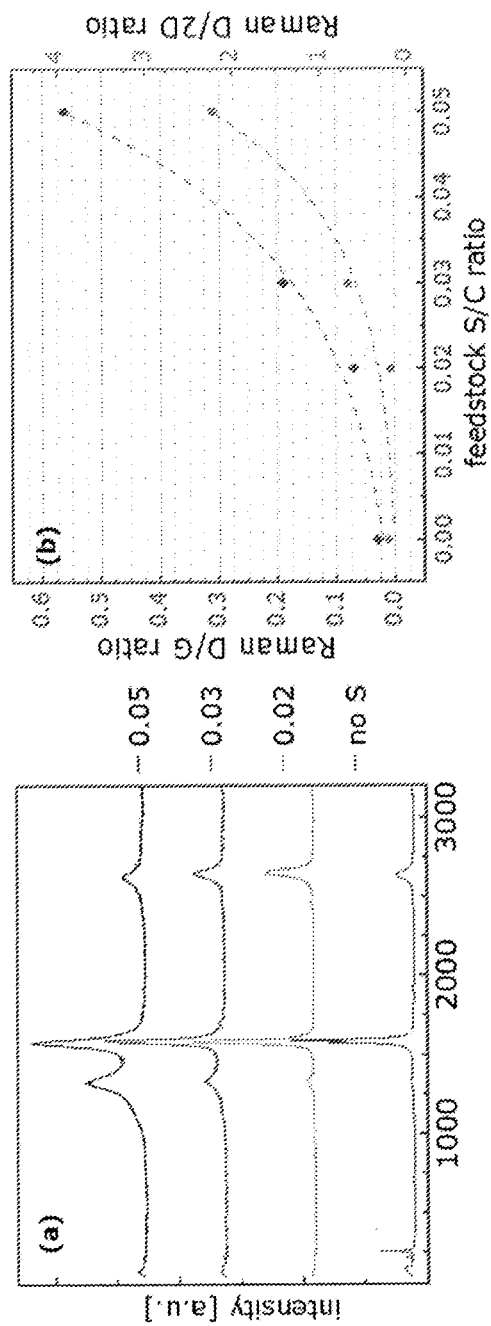
FIG. 9 shows (a) Raman spectra of carbon nanotubes generated from toluene and ferrocene with and without thiophene normalised to the G peak (G=1), offset along the y axis, with the S/C ratio shown in the legend (the spectra are presented in the same order as indicated in the legend); and (b) correlation between SIC ratio in the reaction feedstock and the D/G intensity ratio (upper curve, linear) and the D/2D intensity ratio (lower curve, exponential) in Raman spectroscopy on the resulting fibre.

In an initial set of experiments a material consisting of CNTs could be continuously produced for the first time without addition of heteroatom additive. In this series of experiments the amount of additive was gradually decreased culminating in continuous CNT formation from a feedstock of ferrocene and toluene only. The injection temperature was constant at 330±5° C. Moreover, Raman spectra of samples normalised to the G peak impressively show how the addition of thiophene creates defects or impurities in the CNT based material (FIG. 9a).

Figure 10:
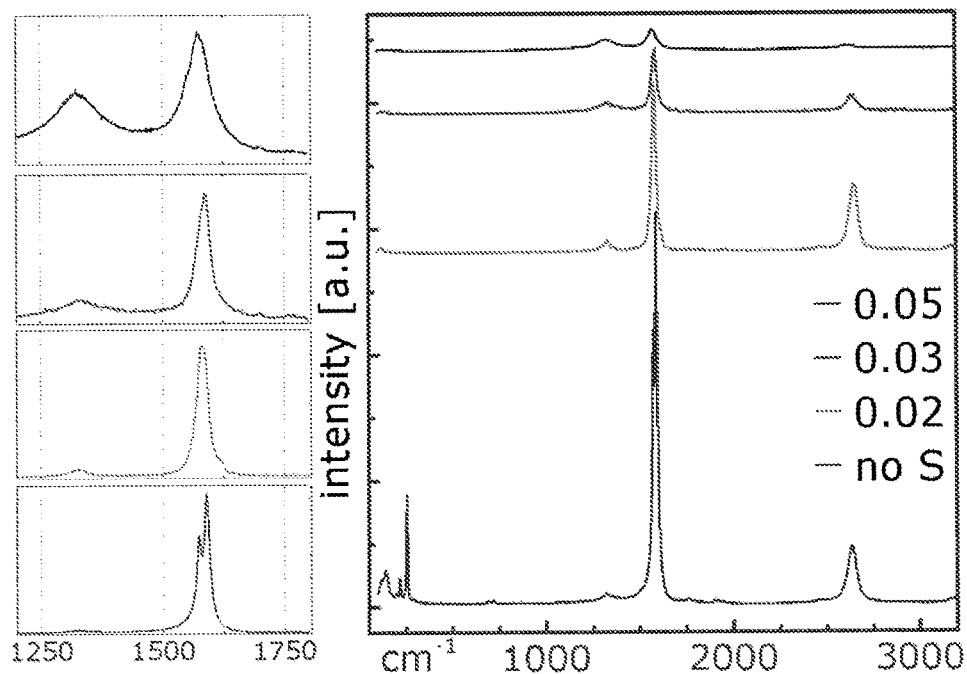
FIG. 10 shows Raman spectra of CNTs generated from toluene and ferrocene with and without thiophene normalised to the D peak (D=1), offset along the y axis with zoom-in on the D and G peak region (the spectra are presented in the same order as indicated in the legend)

FIG. 10 shows the same Raman spectra normalised to the D peak, highlighting the change in the G peak in terms of both intensity and shape as the sulphur amount in the feedstock is decreased. While samples from 2 or 3% sulphur in the feedstock show Gaussian peaks with good separation of G and D peak, increase to 5% S shows less defined separation and a clear increase in D and decrease in 2D peak intensities. The removal of sulphur however brings a remarkable change as the G intensity (1589 cm$^{-1}$) increases by about 4 times and clearly splits off a separate peak at 1573 cm$^{-1}$ (FIG. 10b). Moreover, RBM peaks are visible with a main intensity at 254.0 cm$^{-1}$.

As can be seen in FIG. 9b, an exponential correlation was found between the sulphur amount present for the reaction and the D/G ratio, indicating defects, i.e. sp3 hybridized carbon atoms, in the respective Raman spectra (summarised in Table 1). While the material from an injection feedstock containing 5% sulphur shows a massive D peak, creating a D/G ratio of 0.56, it decreases with decreasing thiophene amounts and shows an almost negligible (0.05) D/G when thiophene injection is stopped. The D/2D ratio displays an exponential dependence on the sulphur content in the feedstock with values around 0.2 for up to 2% and 0.7 for 3% sulphur. Increase to 5% sulphur results in reversed intensities of these two peaks leading to a D/2D ratio of 2 (FIG. 9b, Table 1).

TABLE 1

Raman D/G and D/2D peak intensity ratios according to the amount of sulphur compound in the feedstock (S/C ratio).

| feedstock S/C | Raman D/G | Raman D/2D |
|---|---|---|
| 0.05 | 0.56 | 2.22 |
| 0.03 | 0.19 | 0.67 |
| 0.02 | 0.07 | 0.18 |
| no S | 0.05 | 0.21 |

Figure 11:
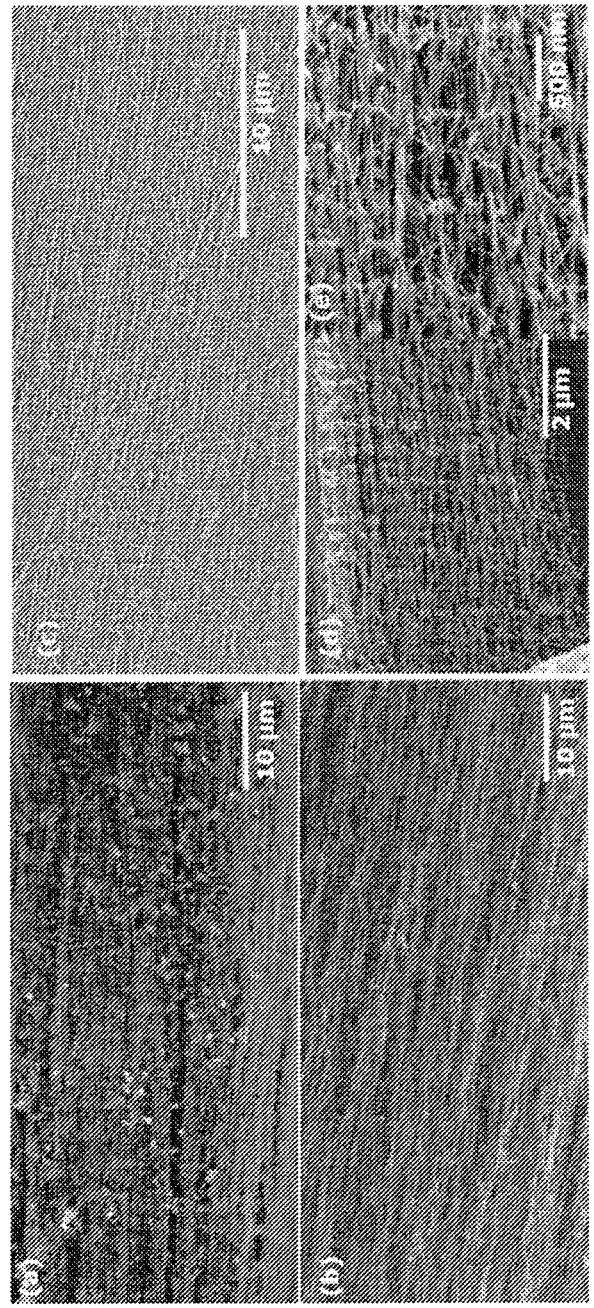
FIG. 11 shows scanning electron microscope (SEM) images of CNT material obtained from toluene, ferrocene (a) with and (b) without thiophene through a single port injector at 15 cm injection depth, (c) at 10 cm injection depth, and corresponding Focused Ion Beam (FIB) images of sample from 10 cm injection depth cut inside along the fibre axis in (d) and (e) at magnification as indicated.

This data is consistent with the SEM images (FIGS. 11a and b) where it is clearly seen that a significant amount of blob-like impurities are incorporated into an aligned network of CNT bundles when thiophene was present in the feedstock (FIG. 11a). However those from a sulphur-free feedstock show remarkably clean CNT based material, with well aligned bundles and a negligible amount of impurities visible at the chosen magnification (FIG. 11b).

Injection Temperature

Figure 12:
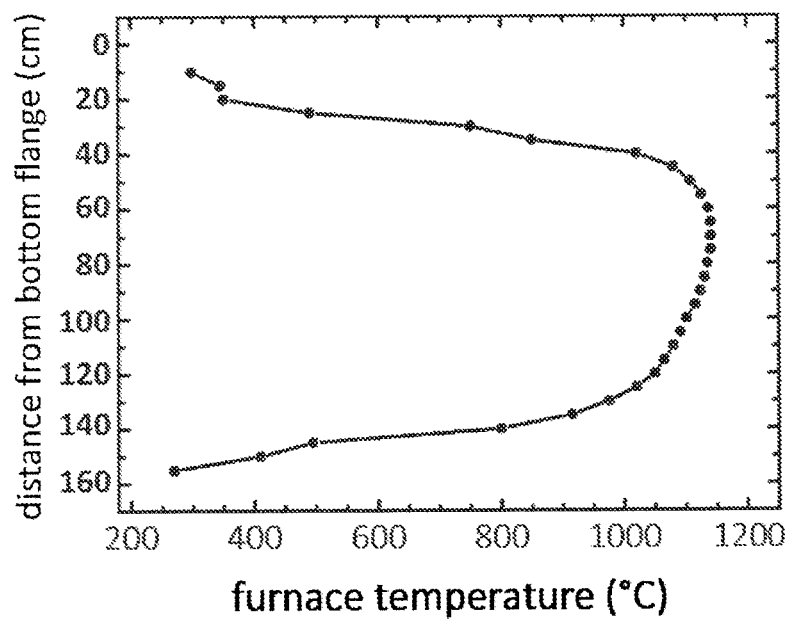
FIG. 12 shows a furnace temperature profile measured in an argon flow of 1.2 litres/minute in the centre of the tube.

Following this observation, the effect of the injection temperature on the process from a feedstock of toluene and ferrocene without heteroatomic additives was investigated. In order to explore different injection temperatures the injection depth was decreased from 15 to 10 and 5 cm. This corresponds to injection temperatures between 200 and 360° C. as a function of injection depth and carrier gas flow (see Table 2) for our furnace in which the temperature of the reaction zone goes up to 1200° C. (the temperature profile is shown in FIG. 12).

TABLE 2

Injection temperature as a function of injection depth and carrier gas flow.

| Inj. T (° C.) | Inj. depth (cm) | hydrogen flow (mL/min) |
|---|---|---|
| 360 | 15 | 1200 |
| 330 | 15 | 1000 |
| 316 | 15 | 900 |
| 300 | 10 | 1500 |
| 250 | 10 | 1350 |
| 238 | 10 | 1200 |
| 234 | 10 | 1050 |
| 228 | 10 | 1000 |

Figure 13:
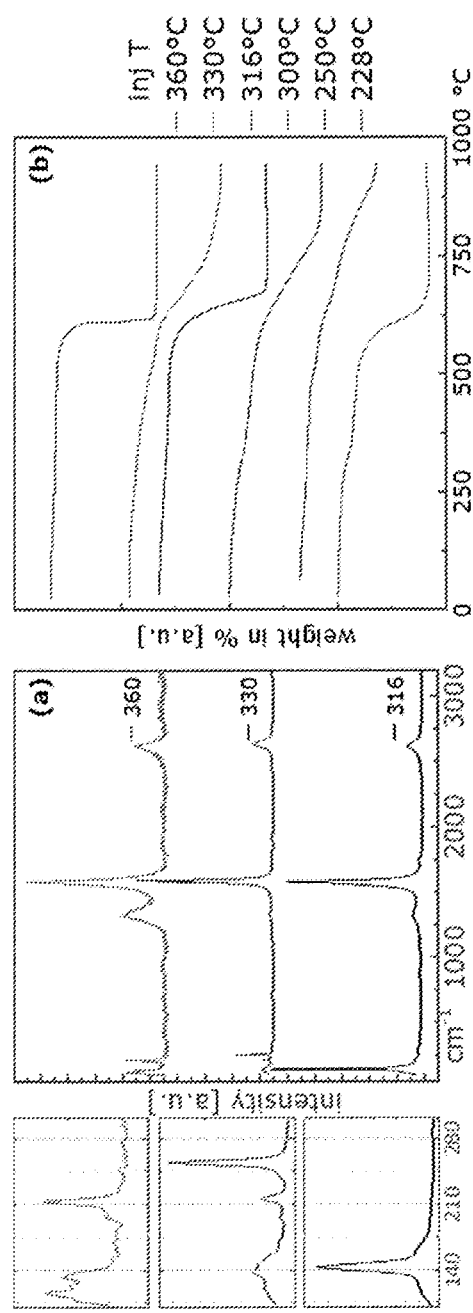
FIG. 13 shows (a) Raman spectra of CNT samples from 15 cm injection depth normalised to the G peak (G=1) listed according to their injection temperature (in ° C.) with zoom-in on radial breathing mode (RBM) region; and (b) thermogravimetric analysis (TGA) of carbon nanotube samples listed according to their injection temperature.

Experiments at 15 cm injection depth showed that CNTs were readily produced continuously entirely without heteroatom additive from injection temperatures of 316±5, 330±5 and 360±5° C., respectively (Table 2). Raman spectra of these samples in FIG. 13 (normalised to the G peak) show that D/G ratios remain very low, 0.03 and 0.09 up to 330° C. The lowest injection temperature shows the most pronounced RBM peak at 142.9 cm$^{-1}$, 330° C. at 254.0 cm$^{-1}$. The higher injection temperature shows a significantly different Raman spectrum with D/G of 0.47. RBMs of similar peak intensities are observed at 114.5, 132.3 and 211.9 cm$^{-1}$.

Figure 14:
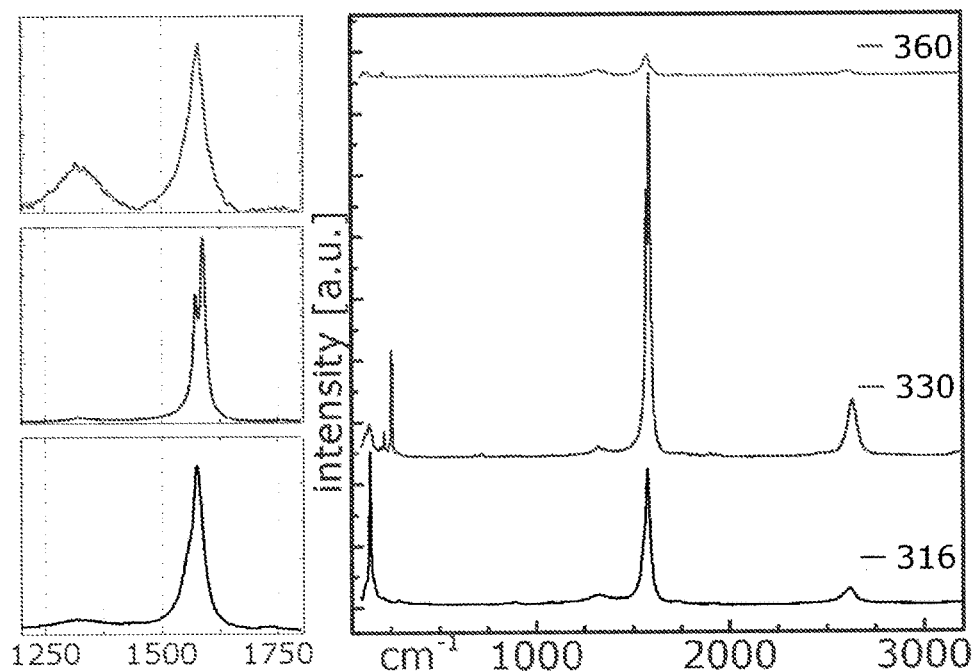
FIG. 14 shows Raman spectra of carbon nanotube samples from 15 cm injection depth normalised to the D peak (D=1) and listed according to their injection temperature offset along the y axis with zoom-in on the D and G peak region.

Normalisation to the D peak (D=1) in FIG. 14 displays more clearly the difference in the G peaks in both shape and intensity. Both samples from 316 and 360° C. show a single Gaussian G peak, the sample from 330° C. is split in the aforementioned 1589 cm$^{-1}$ and 1573 cm$^{-1}$. The 2D peak intensity is highest for the sample from 330° C. (D/2D 0.21) and poor for 360° C. (D/2D 1.33) (data summarised in Table 3).

TABLE 3

Overview of sample values according to injection temperatures.

| Inj. depth (cm) | Inj T (° C.) | Fe/C feedstock | Fe residue (%) | D/G | D/2D | RBM ω ($I_{RBM}/I_G$) |
|---|---|---|---|---|---|---|
| 18 | 360 | 0.0007 | 2.6 | 0.47 | 1.33 | 114.5 (0.52); 211.9 (0.46); 132.3 (0.43) |
| 15 | 330 | 0.002 | 7.4 | 0.03 | 0.21 | 254.0 (0.28); 119.8 (0.07); 137.6 (0.09); 196.0 (0.03); 215.4 (0.07) |

TABLE 3-continued

Overview of sample values according to injection temperatures.

| Inj. depth (cm) | Inj T (° C.) | Fe/C feedstock | Fe residue (%) | D/G | D/2D | RBM ω ($I_{RBM}/I_G$) |
|---|---|---|---|---|---|---|
| 15 | 316 | 0.002 | 0.3 | 0.09 | 0.70 | 142.9 (1.13); 211.9 (0.08); 285.4 (0.06) |
| 10 | 300 | 0.031 | 15 | 0.03 | 0.11 | 150.0 (0.69); 194.2 (0.14); 217.1 (0.09) |
| 10 | 250 | 0.034 | 29 | 0.10 | 0.38 | 218.9 (0.26); 199.5 (0.12); 254.0 (0.08) |
| 10 | 228 | 0.028 | 15 | 0.52 | 4.06 | 201.0 (0.39); 208.0 (0.35) |

In decreasing the injection depth, we found that CNTs could also be successfully continuously produced from injection at 10 cm. Injection at 5 cm did not yield continuous production of CNTs. The material displays almost no surface impurities. Interestingly, the Fe/C ratio that led to successful continuous CNT production was very similar for all samples even though the absolute amounts of precursors injected for reaction were varied between 0.5-2.2 mmol C/min. More or less independent of the injection temperature, the ideal Fe/C ratio was found to be 0.031±0.003 in all cases, so an order of magnitude higher than with injection at 15 cm. As shown before for experiments at an injection depth of 15 cm and corresponding higher injection temperatures between 315 and 360° C., significantly lower (below 0.002) Fe/C ratios lead to successful CNT formation.

Thermogravimetric analysis (TGA) was performed subsequently in order to gain information about the composition of the bulk material. Analysis of iron contents of the various samples shows generally significantly lower residues for samples from higher injection temperatures. Whereas iron contents in samples from injection at 15 cm with Fe/C ratios below 0.002 in the feedstock was found to be between 0.3-7.4 wt %, substantially higher values of 15 and 30 wt % were found for those from 10 cm and Fe/C ratios around 0.03. In the TGA spectra shown in FIG. 13b, different weight loss behaviours could be observed. From TGAs of samples no clear correlation between injection temperature and purity and morphology of the CNTs could be detected. A direct correlation of impurities other than iron and iron remaining in the sample could not be identified.

Figure 15:
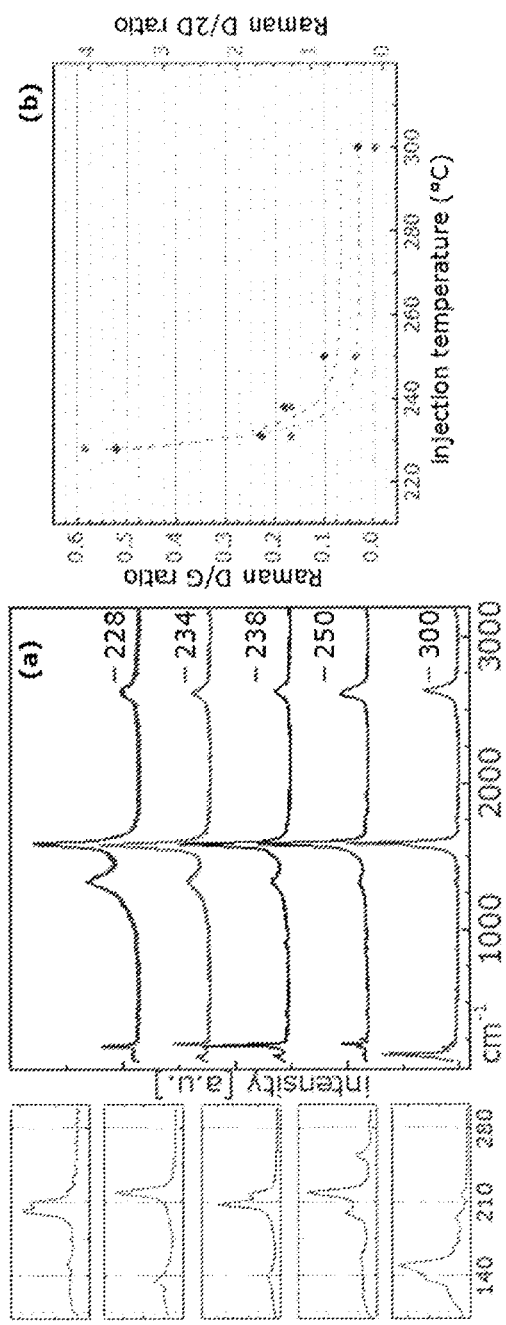
FIG. 15 shows (a) Raman spectra normalised to G for 10 cm injection depth listed according to their injection temperature with a zoom-in on each RBM region; (b) exponential correlation between injection temperature and D/G ratio (squares/diamonds) and D/2D ratio (dots) in the same samples.

The corresponding Raman spectra in FIG. 15a reveal the following trends for injection at 10 cm: RBMs are present along the entire range of injection temperatures but vary in intensity and Raman shift (summarised in Table 3). While the spectrum of the sample from 300° C. injection temperature shows its most pronounced RBM peak at around 150.0 cm$^{-1}$ (FIG. 15a inset, Table 3) lowering the injection temperature yields peaks around 210±15 cm$^{-1}$. According to the aforementioned wavenumber-tube diameter correlation (d=223/(ω−10)) [9] these wavenumbers correspond to tube diameters of 1.67 nm and 1.26-1.09 nm.

To a good approximation both D/G and D/2D ratio are exponentially decreasing with increasing injection temperature as can be seen in FIG. 15b.

In order to get a better impression of CNT features within different samples, electron microscopic investigations were performed (for clarity, sample characteristics and synthesis parameters are summarised in Table 3). We aimed at characterising the entire bandwidth of injection temperatures and are exemplarily presenting the both extremes and the centre point. Findings of a sample obtained at an injection depth of 15 cm (inj. T 360° C.) (hereafter referred to as 15_1) were compared to samples from 10 cm injection depth (hereafter referred to as 10_2 and 10_3 respectively) and a corresponding injection temperature of 228° C. and 300° C. (Table 4). TGA and Raman spectra determined our expectations for investigation with HRTEM. This way, 15_1 with comparatively low Fe content (2.6 wt %) and no low-burning impurities could be compared with 10_2 where in addition to an above average Fe content of 15 wt %, polymeric impurities were present, indicated by a TGA peak at around 340° C. and the high D/G ratio of 0.52. As described earlier, Raman spectra of samples from 10 cm injection depth primarily show RBM peaks, around 150 (10_3) or 210 cm-1 (10_2) respectively whereas 15_1 shows two peaks (114.5 and 211.9 cm-1). Interest in investigating the former more closely, additionally came from its very low D/G ratio (0.03).

TABLE 4

Properties of sample selection for HRTEM imaging.

| | Inj. T (° C.) | D/G | Fe (%) | diam (nm) |
|---|---|---|---|---|
| 15_1 | 360 | 0.09 | 2.6 | 3-18 |
| 10_2 | 228 | 0.41 | 15 | 4-17 |
| 10_3 | 300 | 0.03 | 15 | 0.8-2.5 |

Figure 16:
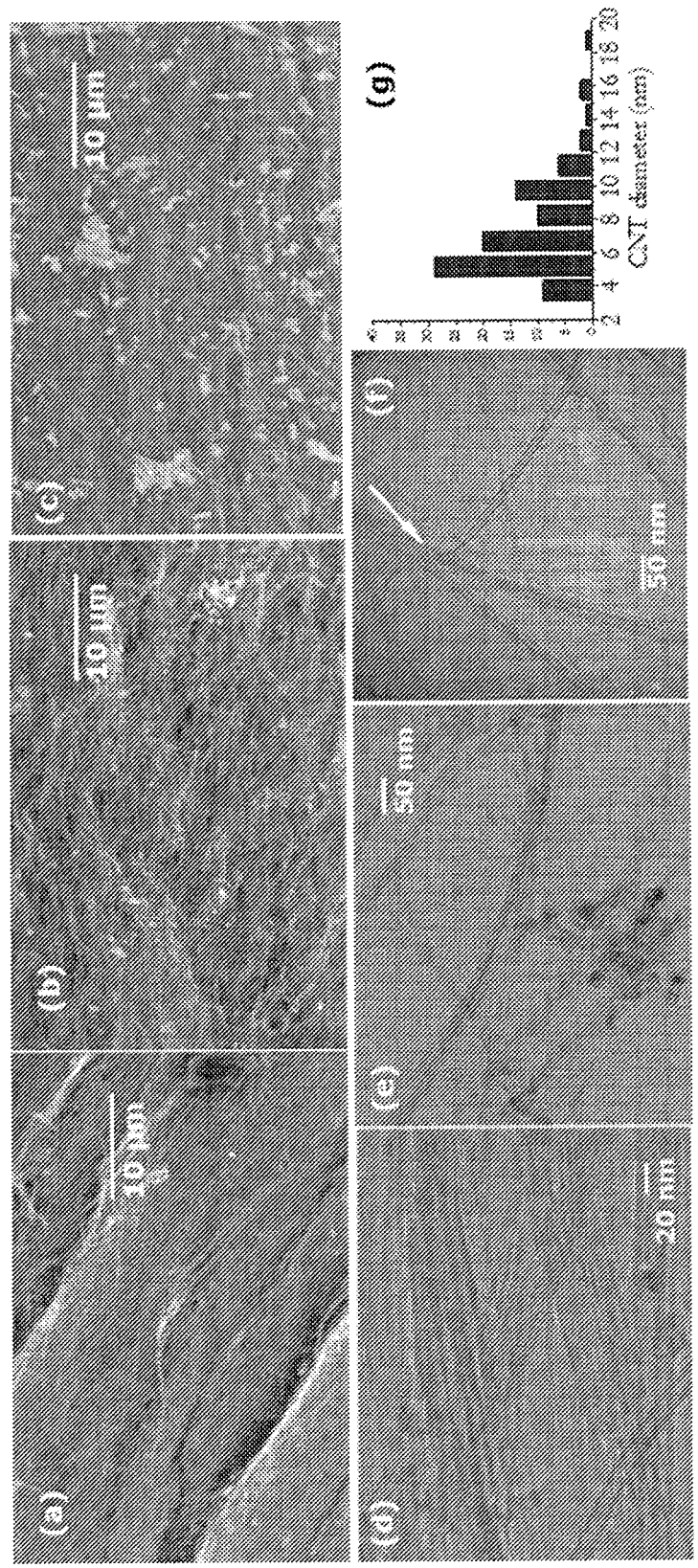
FIG. 16 shows SEM images of samples (a) 15_1, (b) 10_2 and (c) 10_3; and (d) sample 15_1 transmission electron microscope (TEM) bright field (BF) image with catalyst particles incorporated (e) in the network of multiwall nanotubes (MWNTs) and single wall nanotubes (SWNTs) and collapsed tubes (f) (arrow); and in (g) the corresponding tube diameter distribution.
Figure 21:
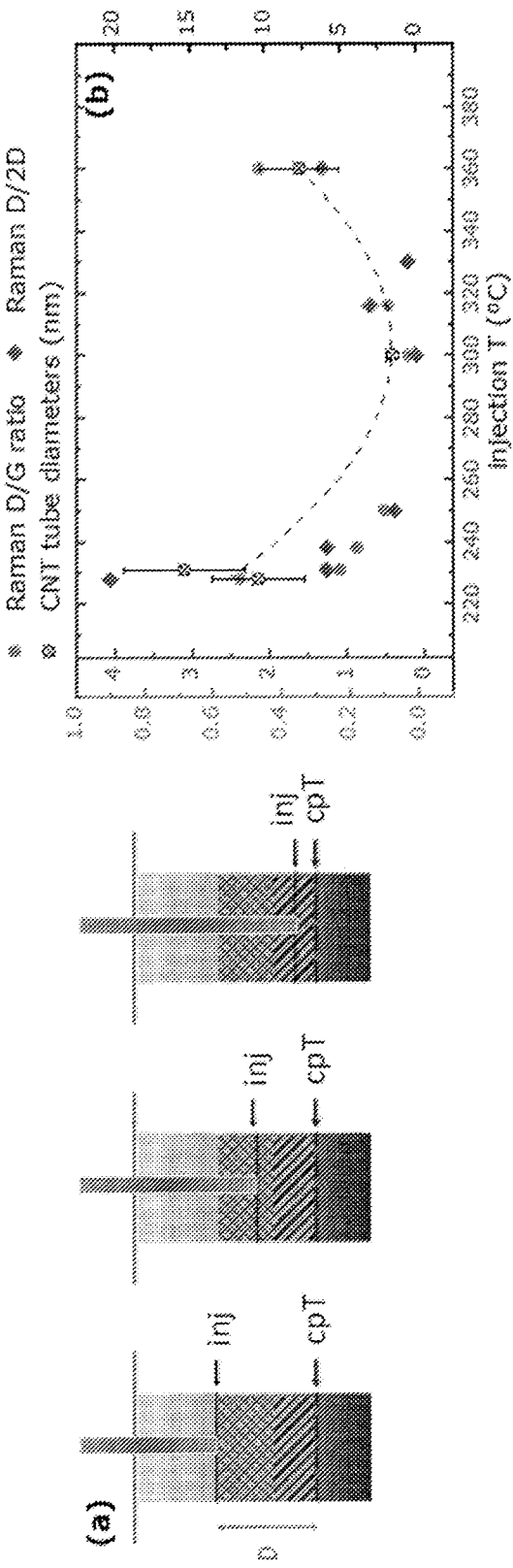
FIG. 21 shows (a) catalyst pyrolisation temperature (cpT—at 400° C.) with respect to the injection temperature with distance D, and (b) correlation of D/G (solid circles) and D/2D (squares) ratios from Raman spectroscopy and the obtained carbon nanotube diameter (hollow circles) with injection temperature.
Figure 22:
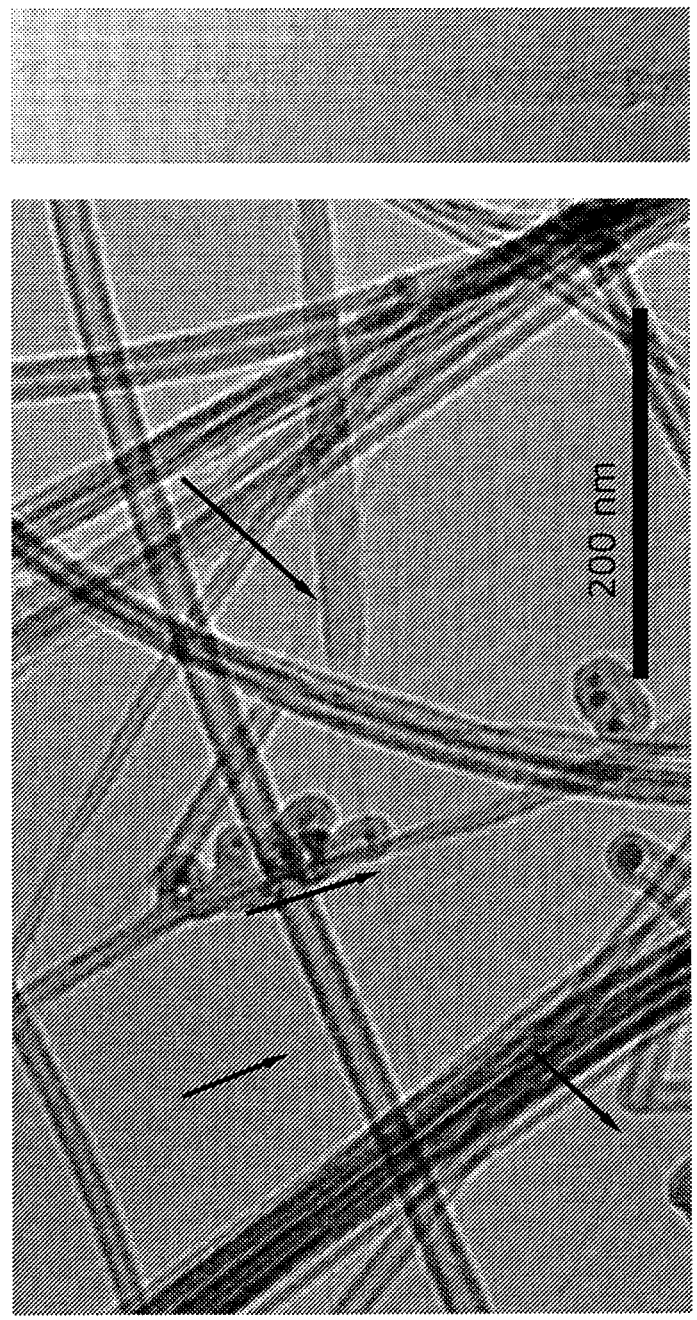
FIG. 22 shows a TEM image of single wall adjuncts to MWNTs of varying diameters (indicated by arrows) providing an explanation for RBMs observed in Raman spectroscopy.

Sample 15_1 shows a single sharp weight loss peak in TGA (FIG. 13b) and impurity free surfaces (FIG. 16a). More surface impurities are visible for 10_2 (FIG. 16b), which also shows a broader weight loss region in TGA. Sample 10_3 finally shows the highest amount of impurities on the surface (FIG. 16c), which is reflected in a very broad weight loss region in TGA (FIG. 13b). To demonstrate that these impurities are concentrated mainly on the surface however, FIG. 11d, e shows the highly pure interior of the product, exemplified by FIB images taken from sample 10_2. In FIG. 16d, a TEM-BF image taken of sample 15_1 shows CNT bundles with small iron particles incorporated in good agreement with the iron residue found in TGA (3%). The sample reveals single wall adjuncts of varying diameter (FIGS. 16e, 21) on the predominant larger diameter tube network as well as collapsed tubes (FIG. 16f). These adjuncts were not considered upon determination of tube diameter distribution (3-18 nm, FIG. 16g).

Figure 17:
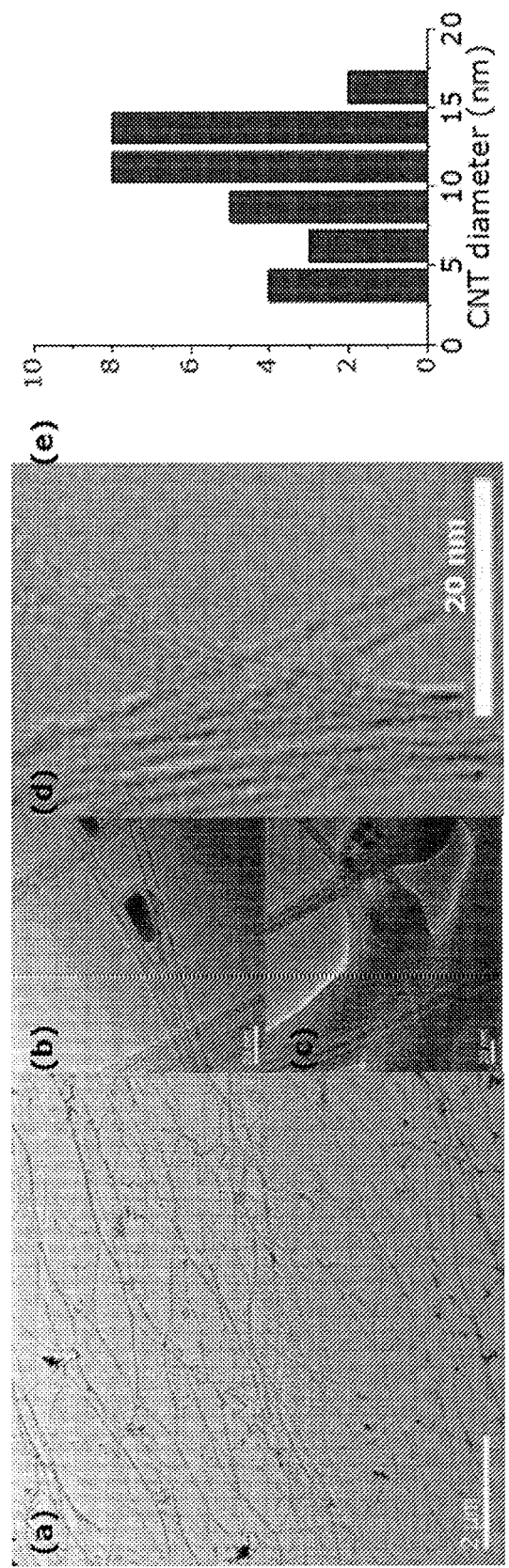
FIG. 17 shows high resolution transmission electron microscope (HRTEM) images of sample 10_2; (a) overview with network of long MWNT bundles with incorporated impurities, (b) catalyst particle between two growing tubes, amorphous material between defective graphene layers, (c) amorphous material molten under electron beam, (d) a bundle of SWNTs and (e) the carbon nanotube diameter distribution in nm.

FIG. 17 shows the HRTEM images from sample 10_2 revealing mostly multi wall tubes with amorphous material incorporated in the graphene layer system. CNT diameters vary between 4 and 17 nm.

Figure 18:
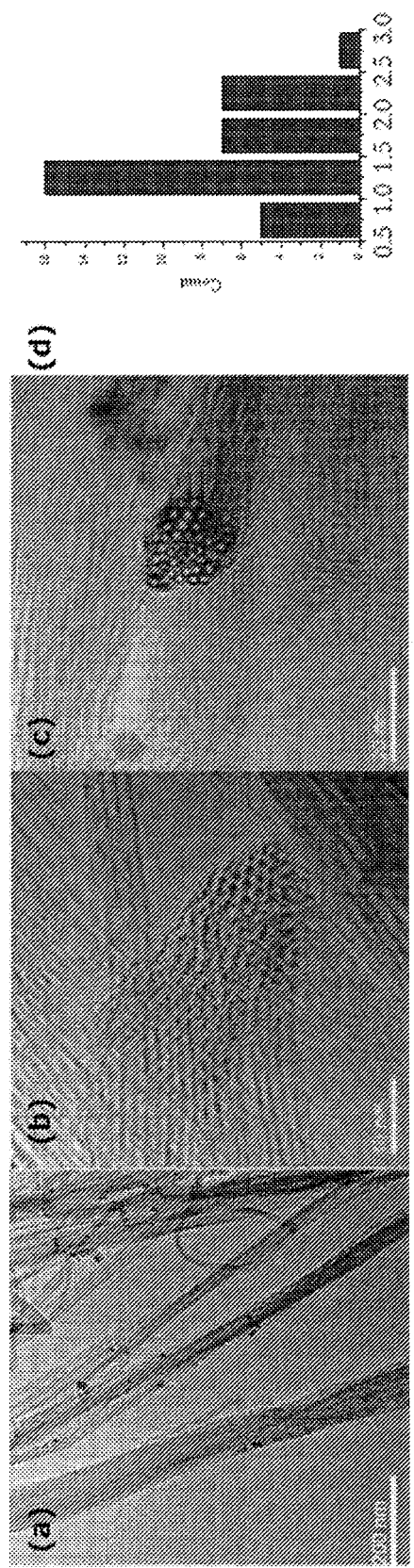
FIG. 18 shows HRTEM of sample 10_3; (a) overview with aligned carbon nanotube bundles with incorporated catalyst particles, (b) SWNT bundle bend, (c) end of a SWNT bundle in top view and (d) carbon nanotube diameter distribution in nm.

Finally, sample 10_3 shows a big step forward in CNT diameter control. As shown in FIG. 18, nicely aligned bundles of SWNTs could be observed in this sample obtained from a higher injection temperature of 300° C. FIG. 18d reveals that these SWNTs possess a mean diameter of 1.50 nm and a fairly narrow distribution between 0.7 and 2.75 nm.

DISCUSSION

Sulphur Effect

From findings in the first set of experiments with altered sulphur content in the feedstock (FIG. 9), its excessive levels in the synthesis zone have a negative effect on the resulting material. The increase in D peak intensity Raman spectroscopy shows clear evidence for an increase in impurities and defects with thiophene in the feedstock. Similarly the lowering of the 2D peak indicates distortions resulting in a lack of resonance within the CNT graphitic lattice. A possible explanation for this is that sulphur forms a coating on the iron particles [10]. This hinders carbon diffusion into the inner parts of the metal, which makes it more quickly available for incorporation into the forming honeycomb structure, which is supported by the observation of slightly lower CNT production rates as thiophene is removed from the injection system (going down from 18 mg/hour to 12 mg/hour). In the case of over-injection however this coating poisons the iron particles, making them unavailable for catalysis. They stay in the sample as impurities, creating defective islands of metal in the CNT bundle network which in turn also induces a decrease in alignment of the bundles within the material. Therefore cleaner material results as no sulphur is present in the feedstock. In agreement with previous reports a thiophene/toluene ratio in the feedstock of around 0.25 produces collapsed double wall tubes, providing an explanation for the good D-G peak separation as well as the missing RBMs in the Raman spectra [10]. The impressive increase in G peak intensity combined with a clear separation of G$^-$ for the sample spun without additive, indicates a distinctly different material from the other samples [11].

Injection Temperature

It is important to note that the heteroatomic additive is not the only potential source of impurities. Floating catalyst CVD is in general a very sensitive method for growing CNTs and will only yield continuous material production under very specific ratios of carbon, catalyst and carrier gas (Tables 2, 3). Pyrolysis of toluene at lower temperatures matches catalyst availability from ferrocene break-down well and enables CNT formation at an early stage within the reactor. The resulting longer reaction time enables SWCNTs to grow to a length which enables them to bundle up due to van der Waals forces and be extracted in a continuous stream. Once these feedstock combinations are identified, the morphology of collected samples therefore depends on subtle parameters within the setup. We have been able to identify the injection temperature as one of the most important parameters. Apart from the injection depth, this temperature strongly depends on the amount of hydrogen, as well as amount and temperature of the carrier gas stream (helium). The most likely explanation for its significance is its effect on the catalyst precursor. Temperatures higher or close to its pyrolysis point (400° C. [2]) within the injector tube start its decomposition already within that confined space of about 4 mm diameter. The shorter mean free path of the evolving iron nanoclusters [2] causes a higher collision and thus coalescence probability. Resulting bigger catalyst particles are believed to generate CNTs with bigger diameters (FIG. 19) [6, 7]. Agglomerations of these clusters (FIG. 20) are not catalytically active for CNT growth and build impurities leading to the observed lower G peak intensity and higher D peak (FIG. 13a). Similarly they lower the resonance of CNT bundles resulting in lower 2D peak intensities.

Injection at temperatures well below the pyrolysis of ferrocene should in turn result in smaller catalyst particles and CNTs. However we expect that upon lowering the injection temperature further too high dilution of iron within the reactor gives way to catalyst poisoning by excess carbon and again impurities in the material. That injection at 5 cm did not yield in CNT synthesis may be a result from a too low injection temperature (below 200° C.). It could also be attributed to a convection phenomenon described for the vertical reactor setup [2] probably preventing most of the precursor from advecting into the reaction zone.

The injection temperature affects the morphology of the material obtained from 10 and 15 cm injection depth (FIG. 15a). Screening samples across the range from 360 (close to ferrocene pyrolysis) to 220° C., we were able to identify the "turning point", the injection temperature region optimal for small diameter CNT growth with low defects as 310±15° C.

Further valuable information provided SEM and HRTEM investigations (sample properties summarised in Table 4). As observations from sample 15_1 FIG. 16d,e reveal, tube diameters vary widely from 3 to approximately 18 nm. The random size distribution suggests little control over the catalyst particle size which can be explained by the high temperature at the point of injection (360° C.). Considering that this temperature is close to the pyrolysation temperature of ferrocene (400° C. in hydrogen, FIG. 21a) [2], it is likely that iron becomes available from the precursor partly already within the injector tube. The shorter mean free path will cause more frequent collision between and thus coalescence of iron atoms to subsequently big but randomly size distributed clusters. Another part of ferrocene will still break up only within the reactor tube, providing an explanation for smaller tubes found in the sample.

It is known that CNTs burn in air between 500-800° C. depending on their diameter, number of walls and amount of defects whereby small tubes burn at lower temperatures [12], [13]. Apart from different CNT types, polymeric type substances like carbohydrates could be identified by their lower combustion temperatures between 300-425° C. A single sharp weight loss thus indicates the presence of CNTs only with similar diameters without any further carbonaceous impurities which is the case in our samples with iron contents below 3% (15_1). To explain this correlation in more detail, it is important to understand that the iron remainder in a sample almost never derives from the catalytically active iron particles. High iron residues therefore stem from poisoned—i.e. carbon coated—clusters of small metal particles (TEM images in FIG. 20). This carbon coating can be of graphitic nature, but always requires defects in the hexagon structure to mimic the shape of the almost spherical or oval metal particles. It will therefore be less stable than carbon nanotubes and show as lower temperature impurities. For sample 10_2 FIG. 17 b,c impressively show how these melt under the electron beam, which can be correlated with the mass loss observed in TGA around 340° C.

The injection temperature in the case of sample 10_2 was 228° C. which is far below the ferrocene pyrolisation temperature. We should expect a long mean free path for iron atoms within the carrier gas stream. Iron clusters will be comparatively small, but potentially also too small to catalyse the reaction to CNTs. These particles will get poisoned by the carbon as it becomes available and should be visible as impurities in the sample (FIG. 6a). Randomly distributed bigger clusters of metal should enable the formation of a range of CNTs with potentially wide diameters. Moreover, confirming our assumption in terms of injection temperature, many catalyst particles with various shapes like obelisk, round as well as oval and around them many short tubes can be seen in FIG. 20. Together with partly collapsed tubes these provide an explanation for the fairly high D peak in the collected Raman spectra (D/G 0.52). Occasional single wall tubes, shown in FIG. 17d, result in observed RBM peaks (FIG. 15a). Tube sizes vary evenly between 2 and 16 nm (FIG. 17e), offering an explanation for the different pyrolisation behaviour found in the TGA spectrum (FIG. 13b).

Figure 20:
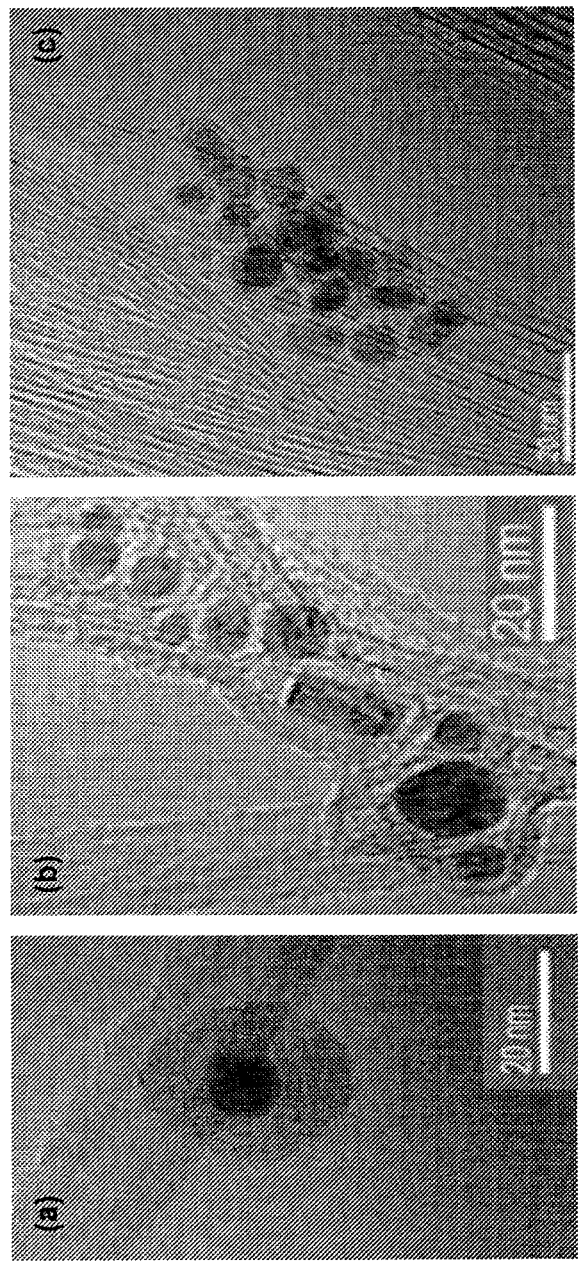
FIG. 20 shows catalyst poisoning in various carbon nanotube samples: (a) multiple graphene layers encapsulating a round catalyst particle, (b) metal particles in various shapes, cluster created by carbon layering, and (c) agglomerate of oval catalyst particles.

Combination of comprehensive characterisation of samples shows a good agreement between nanostructure investigations in Raman and TEM, as well as microstructure characterisation in SEM and TGA for sample 10_3, representative for the injection temperature region around 300° C. SEM images (FIG. 16c) revealed a number of surface impurities which are believed to be responsible for the various different low-burning substances identified in TGA. It is proposed that this represents the ideal temperature in terms of ferrocene pyrolisation occurring just after injection but not yet within the injector. Iron particles with a narrow particle size distribution could grow to just the right size for being catalytically active but not further yet by the time carbon becomes available from toluene pyrolysis. Supporting this consideration, TEM images in FIG. 20 show a number of catalyst particles having almost the same diameter. Moreover, the extremely low disorder found in Raman spectroscopy (D/G 0.03) is supported by TEM images that show barely any impurities apart from superfluous metal particles (FIG. 18a) potentially disturbing the structures in the CNT network (FIG. 18b, c). The CNT diameter distribution in this sample is narrow between 0.8 and 2.5 nm. Most counts lie between 1 and 1.5 nm in good agreement measured RBM peaks at 150.0 (1.67), 194.1 (1.27) and 217.1 $cm^{-1}$ (1.13 nm) (FIG. 15a).

Figure 19:
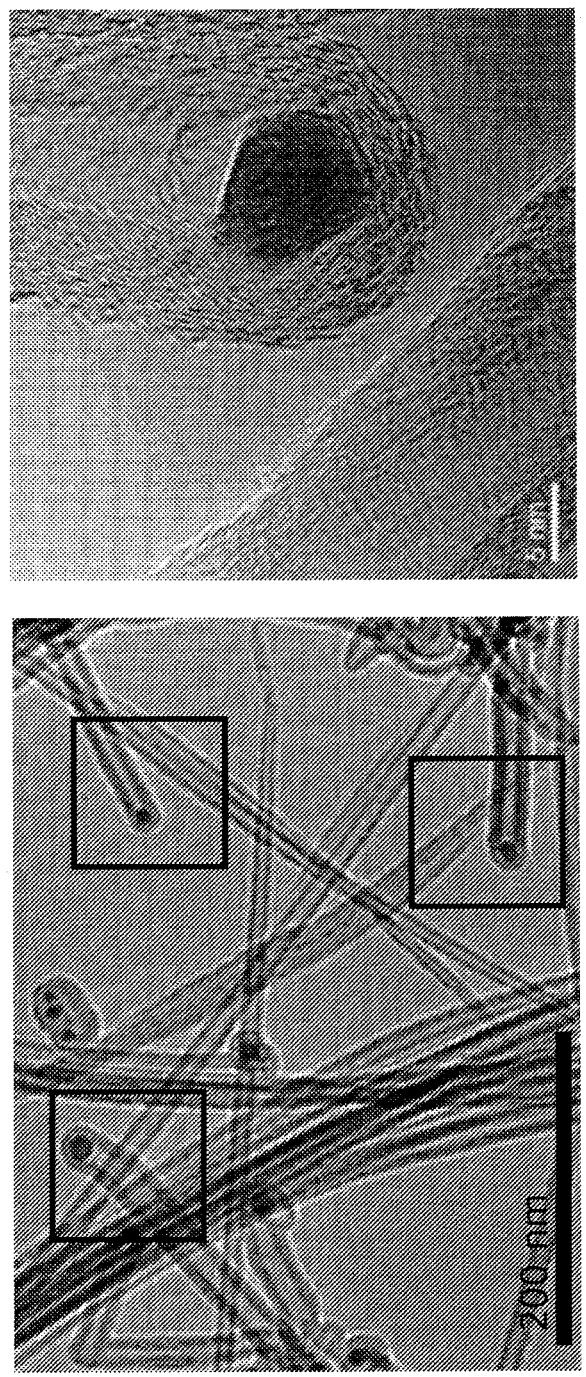
FIG. 19 shows herringbone structured MWNT with catalyst particle confirming assumption of epitaxial growth.

FIG. 21a shows pyrolisation of ferrocene (cpT) in relation to the temperature at injection point. At cpT transition metal 400° C. iron atoms become available and will start to collide and coalesce into catalytically active clusters. As the distance D between injection and the point of catalyst precursor pyrolysis gets smaller the collision probability between nascent catalyst atoms is higher and the preceding dispersion period of precursor molecules shorter. A higher number of collisions leads to bigger metal clusters. CNTs display diameters that match these metal cluster sizes (FIG. 19). As demonstrated above we found that the injection ideally occurs at about 310±15° C. which leads to mainly SWNTs (FIG. 13a, sample 316° C. and sample 10_3 FIG. 18). At significantly lower injection temperatures (<230° C.) the longer reaction zone yields a wider variety of tube diameters with on average significantly bigger multi wall tubes (FIG. 21b, CNT diameter). The greater reactant diffusion also supports formation of by-products as demonstrated in FIG. 21b, Raman D/G vs. injection temperature. Similarly, bigger diameter CNTs are formed as the injection temperature exceeds its optimal range. The proximity of injection to catalyst pyrolysis temperature leads to a partial break up of catalyst already within the injector pipe. The significantly shorter mean free path within the confinement of the injector stem leads to bigger catalyst clusters. The wide CNT diameter range is explainable by some ferrocene pyrolysing within the injector while some of the material does not break up until the bigger volume of the reaction tube.

Concluding Remarks

In the present work it has been demonstrated that it is possible to continuously produce single wall carbon nanotubes (SWCNTs) using a floating catalyst CVD process from ferrocene and a carbon source only, without addition of sulphur or any other heteroatomic precursor. The appropriate carbon source for this experimental setup was found to be toluene. The absence of sulphur in the process enhances the purity of the sample. Indicated by very low D/G ratios in Raman spectra of just 0.03, it was possible to produce CNTs with almost no impurities such as polymeric structures or encapsulated iron particles. The catalyst structure is correlated with the CNT type formed and could be controlled solely by selecting the appropriate carbon source and adjusting the temperature at the injection point. Presented results show that continuous production of carbon nanotubes of defined diameter can be performed successfully without sulphur precursors avoiding the drawbacks. To the knowledge of the inventors, this disclosure is the first to report that continuous production of SWCNT is possible without sulphur as a promoter, in fact without addition of any sort of heteroatom additive, like sulphur, nitrogen or oxygen.

Further, this study shows the effects of avoiding sulphur on the morphology of the CNT fibres using a precursor system of toluene and ferrocene. Beside the fact that this process provides a less toxic way to form CNT fibres from fewer ingredients than those reported so far, the resulting material shows to be cleaner and at optimised conditions made from long bundles of SWCNTs.

REFERENCES

[1] Motta M, Kinloch I, Moisala A, Premnath V, Pick M, Windle A. The parameter space for the direct spinning of fibres and films of carbon nanotubes. Phys E Low-Dimensional Syst Nanostructures 2007; 37:40-3.

[2] Conroy D, Moisala A, Cardoso S, Windle A, Davidson J. Carbon nanotube reactor: Ferrocene decomposition, iron particle growth, nanotube aggregation and scale-up. Chem Eng Sci 2010; 65:2965-77.

[3] Singh C, Shaffer M S, Koziol K K K, Kinloch I A, Windle A H. Towards the production of large-scale aligned carbon nanotubes. Chem Phys Lett 2003; 372:860-5.

[4] Li Y-L, Kinloch I A, Windle A H. Direct spinning of carbon nanotube fibers from chemical vapor deposition synthesis. Science (80-) 2004; 304:276-8.

[5] Koziol K, Vilatela J, Moisala A, Motta M, Cunniff P, Sennett M, et al. High-Performance Carbon Nanotube Fiber. Science (80-) 2007; 318:1892-5.

[6] Schäffel F, Kramberger C, Ru M H, Grimm D, Mohn E, Gemming T, et al. Nanoengineered Catalyst Particles as a Key for Tailor-Made Carbon Nanotubes. Chem Mater 2007:5006-9.

[7] Fiawoo M-F, Bonnot A-M, Amara H, Bichara C, Thibault-Pénisson J, Loiseau A. Evidence of Correlation between Catalyst Particles and the Single-Wall Carbon Nanotube Diameter: A First Step towards Chirality Control. Phys Rev Lett 2012; 108:1-5.

[8] Gavillet J, Loiseau A, Journet C, Willaime F, Ducastelle F, Charlier J-C. Root-Growth Mechanism for Single-Wall Carbon Nanotubes. Phys Rev Lett 2001; 87:2-5.

[9] Milnera M, Kurti J, Hulman M, Kuzmany H. Periodic resonance excitation and intertube interaction from quasicontinuous distributed helicities in single-wall carbon nanotubes. Phys Rev Lett 2000; 84:1324-7.

[10] Motta M S, Moisala A, Kinloch I A, Windle A H. The role of sulphur in the synthesis of carbon nanotubes by chemical vapour deposition at high temperatures. J Nanosci Nanotechnol 2008; 8:2442-9.

[11] Jorio A, Pimenta M A, Filho A G S, Saito R, Dresselhaus G, Dresselhaus M S. Characterizing carbon nanotube samples with resonance Raman scattering. New J Phys 2003; 5:139.1-139.17.

[12] Pang L S K, Saxby J D, Chatfield S P. Thermogravimetric analysis of carbon nanotubes and nanoparticles. J Phys Chem 1993; 97:6941-2.

[13] Bom D, Andrews R, Jacques D, Anthony J, Chen B, Meier M S. et al. Thermogravimetric Analysis of the Oxidation of Multiwalled Carbon Nanotubes: Evidence for the Role of Defect Sites in Carbon Nanotube Chemistry. Nano Lett 2002; 2:615-9.

The invention claimed is:

1. A floating catalyst chemical vapor deposition system for producing nanotubes, the system comprising:
   a source of a nanotube-material precursor;
   a source of a catalyst precursor;
   a heatable reaction chamber;
   at least one heater for heating the nanotube-material precursor and the catalyst precursor; and
   at least one injector for injecting said precursors into the reaction chamber;
   wherein, in use, the catalyst precursor is pyrolysed within the reaction chamber to produce catalyst particles, and the nanotube-material precursor is pyrolysed within the reaction chamber in the presence of the catalyst particles in order to produce nanotubes;
   and
   wherein the at least one injector includes an injection pipe having an adjustable length within the reaction chamber, the injection pipe extending into the reaction chamber to an adjustable extent in order to control an injection temperature of at least one of the catalyst precursor or the nanotube-material precursor.

2. The system according to claim 1, wherein the nanotube-material precursor is one of a carbon precursor selected from the group consisting of ethanol, hexane, methane, and toluene, or a boron nitride precursor consisting of borazine.

3. The system according to claim 1, wherein the catalyst precursor comprises one of a transition metal derivative selected from the group consisting of cobaltocene, ferrocene, nickelocene, and iron pentacarbonyl, or a non-metallic precursor selected from the group consisting of zirconium oxide powder and silica powder.

4. The system according to claim 1, wherein no heteroatomic additives are provided to the catalyst particles.

5. The system according to claim 1, configured to inject the nanotube-material precursor using a carrier gas.

6. The system according to claim 1, configured to inject the catalyst precursor using a carrier gas.

7. The system according to claim 1, further comprising a first injection pipe for injecting the nanotube-material precursor into the reaction chamber, and a second injection pipe for injecting the catalyst precursor into the reaction chamber.

8. The system according to claim 7, further comprising a third injection pipe for injecting a process gas into the reaction chamber.

9. The system according to claim 1, further comprising a common injection pipe for injecting at least two of the nanotube-material precursor, the catalyst precursor and a process gas into the reaction chamber.

10. The system according to claim 9, wherein the at least two of the nanotube-material precursor, the catalyst precursor and the process gas are pre-mixed before supplying them to the common injection pipe.

11. The system according to claim 1, further comprising an injector subsystem including:
    a first portion having a first set of injection pipes for receiving species for delivery into the reaction chamber; and
    an interface portion that is removably attachable between the first portion and the reaction chamber, the interface portion including at least one injection pipe arranged to receive the species provided by the first set of injection pipes and to inject said species into the reaction chamber;
    the injector subsystem being operable such that, with the interface portion removed, said first set of injection pipes is operable to individually inject their respective species into the reaction chamber, and with the interface portion attached, a pre-mixing chamber is defined by the interface portion in combination with the first portion, for pre-mixing the species provided by the first set of injection pipes prior to the species entering the at least one injection pipe of the interface portion.

12. The system according to claim 11, wherein the extent to which each of the first set of injection pipes protrudes within the first portion is adjustable.

13. The system according to claim 11, wherein the extent to which the at least one injection pipe of the interface portion extends into the reaction chamber is adjustable.

14. The system according to claim 11, wherein, when the interface portion is attached, the pre-mixing chamber has side walls provided by one of the first portion, the interface portion, and partly by the first portion and partly by the interface portion.

15. The system according to claim 11, wherein the injector subsystem includes at least one temperature sensor and at least one heating element for controlling the temperature of the species being injected.

16. The system according to claim 11, wherein the walls of the injector subsystem are formed from metal.

17. The system according to claim 16, wherein the walls of the injector subsystem are formed from a single piece of metal.

18. The system according to claim 1, further comprising a continuous extractor for extracting the nanotubes.

* * * * *